United States Patent
Larsen et al.

(10) Patent No.: US 11,127,778 B2
(45) Date of Patent: Sep. 21, 2021

(54) LIGHT EMITTING TRANSDUCER

(71) Applicant: Flexucell ApS, Østervraa (DK)

(72) Inventors: Jens William Larsen, Dronninglund (DK); Hans-Erik Kiil, Sønderborg (DK)

(73) Assignee: Flexucell ApS

( * ) Notice: Subject to any disclaimer, the term of this patent is extended or adjusted under 35 U.S.C. 154(b) by 0 days.

(21) Appl. No.: 16/488,505

(22) PCT Filed: Feb. 22, 2018

(86) PCT No.: PCT/DK2018/050035
§ 371 (c)(1),
(2) Date: Aug. 23, 2019

(87) PCT Pub. No.: WO2018/153421
PCT Pub. Date: Aug. 30, 2018

(65) Prior Publication Data
US 2020/0243599 A1     Jul. 30, 2020

(30) Foreign Application Priority Data

Feb. 24, 2017  (DK) .......................... PA 2017 70143

(51) Int. Cl.
*H01L 31/113*  (2006.01)
*H01L 21/00*  (2006.01)
(Continued)

(52) U.S. Cl.
CPC ........ *H01L 27/156* (2013.01); *H01L 27/3248* (2013.01); *H01L 2227/323* (2013.01); *H01L 2251/5338* (2013.01)

(58) Field of Classification Search
CPC .................... H01L 51/0097; H01L 2251/5338
(Continued)

(56) References Cited

U.S. PATENT DOCUMENTS 8,907,376 B2 * 12/2014 Mascaro ............ A61B 5/14552
257/181
9,480,151 B2 * 10/2016 De Kok ................. H05K 3/325
(Continued)

FOREIGN PATENT DOCUMENTS

DE   10 2014 005 228 A1   12/2015
EP    3 002 798 A1    4/2016
(Continued)

OTHER PUBLICATIONS

Danish Search Report dated Jul. 19, 2017 for Corresponding Danish Patent Application No. PA 2017 70143, 3 pages.
(Continued)

*Primary Examiner* — Calvin Lee
(74) *Attorney, Agent, or Firm* — Vista IP Law Group, LLP

(57) ABSTRACT

A light emitting transducer including a flexible sheet having a bottom side and a top side, the flexible sheet including a substrate that is stretchable and compressible, the substrate having a bottom substrate surface at the bottom side, and a top substrate surface facing towards the top side, the top substrate surface comprising a surface pattern of a plurality of raised and depressed micro-scale surface portions which extend in at least one direction; a light emitting diode layer above the substrate and conforming in shape to the top substrate surface, the light emitting diode layer corresponding with the surface pattern of the top substrate surface, wherein the light emitting diode layer has a bottom diode surface facing towards the bottom side, and a top diode surface facing towards the top side, a bottom electrode on the bottom diode surface, and a top electrode on the top diode surface.

17 Claims, 14 Drawing Sheets

(51) Int. Cl.
*H01L 27/15* (2006.01)
*H01L 27/32* (2006.01)

(58) Field of Classification Search
USPC .............. 257/88, 95, 258, 294; 438/57, 780
See application file for complete search history.

(56) References Cited

U.S. PATENT DOCUMENTS

| | | |
|---|---|---|
| 9,613,911 B2* | 4/2017 | Rogers .................... H01L 24/97 |
| 9,936,574 B2* | 4/2018 | Rogers ................. A61B 5/6867 |
| 2004/0222740 A1 | 11/2004 | Kim |
| 2006/0169989 A1 | 8/2006 | Bhattacharya et al. |
| 2007/0116932 A1 | 5/2007 | Van Der Tempel |
| 2012/0243092 A1 | 9/2012 | Muller |

FOREIGN PATENT DOCUMENTS

| | | |
|---|---|---|
| EP | 3 025 791 A1 | 6/2016 |
| WO | WO 2000/070691 A1 | 11/2000 |
| WO | WO 2008/030960 A2 | 3/2008 |
| WO | WO 2015/112467 A1 | 7/2015 |
| WO | WO 2018/153421 A2 | 8/2018 |

OTHER PUBLICATIONS

International PCT Search Report dated Apr. 26, 2018 for Corresponding PCT Application No. PCT/DK2018/050035, 5 pages.
Kim, Jung-Hoon et al, "Improving the flexibility of large-area transparent conductive oxide electrodes on polymer substrates for flexible organic light emitting diodes by introducing surface roughness" Organic Electronics, Dec. 2013, vol. 14, Issue 12, pp. 3444-3452.

* cited by examiner

A:

B:

A:

B:

LIGHT EMITTING TRANSDUCER

RELATED APPLICATION DATA

This application is the national stage of International Patent Application No. PCT/DK2018/050035 filed on Feb. 22, 2018, which claims priority to and the benefit of Danish Patent Application No. PA 2017 70143 filed on Feb. 24, 2017. The entire disclosures of both of the above applications are expressly incorporated by reference herein.

FIELD

The present disclosure relates to a transducer in the form of a light-emitting transducer of the type indicated in the preamble to claim 1.

BACKGROUND

The expression transducer shall in connection with the present disclosure be understood as electricity to electromagnetic radiation, such as light.

It is well known that it is challenging to produce a light emitting device, which is flexible i.e. is capable of changing shape without introducing defects to the light emitting device or at least without introducing to severe lifetime destroying defects to the light emitting device.

This is true for the different kinds of light-emitting diodes (LED) i.e. OLED, PLED, inorganic LED.

OLED devices, which enable so-called 2.5D structure, do exist. These OLED devices may only be bent in one direction for each single surface. Thus, the OLED devices cannot be placed on all curved surfaces without introducing severe life-time reducing defects to the structure.

One of the challenges with flexible organic LEDs is that bending introduces cracks in the thin film encapsulation layers, which allows oxygen or moisture to get in contact with the organic layers, which is detrimental to the organic layers.

Another challenge with flexible LEDs is that bending may introduce cracks in transparent electrode, which is typically made of brittle material such as indium tin oxide (ITO).

The bending radii before introduction of severe defects in above mentioned examples are in the order of centimeters and this limits the area of use.

EP3002798 describes a stretchable/foldable optoelectronic device. The device comprises a flexible substrate having electronic layers on top of the substrate. The optoelectronic device is made stretchable by pre-straining the flexible substrate in a first dimension before depositing the electronic layers. The substrate is afterwards allowed to relax which causes the substrate to retract along the first dimension, thereby bending the electronic layers along the first dimension. This causes the optoelectronic device to have wavy structure. Afterwards a force can be applied along the first dimension and the wavy structure may then be stretched out once more. The problem with this method of making a stretchable optoelectronic device is that the wavy structure is formed randomly along the first dimension which causes the optoelectronic device to have internal stresses, and a force applied to the optoelectronic device may cause the layers to crack. The problem is even larger if the substrate is pre-strained along a first and a second dimension causing the wavy structure to be even more randomly distributed causing the internal stresses to be even larger.

Thus, there is a need for a more reliable light emitting transducer capable of being stretched in at least one direction and a method of producing said light emitting transducer.

SUMMARY

It may be desirable for light emitting devices capable of bending to bending radii below the order of centimetre without the introduction of severe lifetime reducing cracks.

Furthermore, it may be desirable for LEDs or OLEDs capable of bending in two directions at the same time, thereby gaining a true 3D structure. To enable bending in two directions the LED/OLED film need to be stretched and/or compressed.

In accordance with one or more embodiments, a transducer has a flexible structure, such that the field of application of the transducer in practice may be considerably increased, and such that it is possible to attach the transducer to various surfaces and possibly varying shapes.

The light emitting transducer according to the embodiments described herein is characterized in that a flexible sheet has a bottom side, a top side and a substrate which is stretchable and compressible.

The substrate has a bottom substrate surface at the bottom side and a top substrate surface with a micro-scale surface pattern of a plurality of raised and depressed surface portions [structures] which extend in at least one direction. Said top substrate surface faces towards the top side.

The micro-scale surface pattern on the top substrate surface is produced in accordance with a desired effect in mind, meaning that the waves and/or corrugations are produced in accordance with calculated and specified values for each of the parameters describing the plurality of raised and depressed surface portions, these parameters being shape, amplitudes, periods and directions of the waves and/or corrugations.

The micro-scale surface pattern is defined by imprint tools forming the top substrate surface.

The micro-scale surface pattern may be made by a hot embossing process forming the top substrate surface.

The micro-scale surface pattern may be made by a slot die casting process forming the top substrate surface.

The micro-scale surface pattern has a large effect on the mechanical characteristics of the flexible light emitting transducer in respect of flexibility and robustness.

The substrate may be made of transparent films such as transparent PET (Polyethylene terephthalate) or PEN (Polyethylene naphthalate) or PUR/PU (Polyurethane) or PDMS Silicones (Polydimethylsiloxane) or polymer blends incorporating silicones.

The substrate may have a thickness between 5-500 µm, 10-300 µm or 30-100 µm.

The substrate may be made of transparent or non-transparent polymers or polymer blends depending on whether the light emitting transducer is a bottom emitter or a top emitter. A bottom emitter emits light through the bottom side of the flexible sheet and a top emitter emits light through the top side of the flexible sheet.

The substrate material must be flexible i.e. stretchable and/or compressible as this property is paramount for the transducer being bendable in one or more directions.

A light emitting diode layer is positioned above the substrate, the diode layer conforms in shape to the top substrate surface and has the surface pattern of the raised and depressed surface portions which extend in the at least one direction.

The diode layer has a bottom diode surface facing towards the bottom side and a top diode surface facing towards the top side.

In an embodiment the diode layer has an area of the top diode surface that is larger than the surface area occupied by the bottom substrate surface in a relaxed state.

The light emitting transducer further comprises a bottom electrode on the bottom diode surface, a top electrode on the top diode surface.

The light emitting transducer may further have a top protection layer positioned above the top electrode for improved protection.

At least one of the electrodes is transparent as the transducer is either emitting light through the top side or the bottom side or both sides.

The non-transparent electrode may have a thickness between 15-200 nm, 20-50 nm.

The transparent electrode may have a thickness between 5-200 nm, 10-100 nm or 20-50 nm.

The light emitting diode layer is less stretchable and less compressible than the substrate. The top electrode and the bottom electrode are also less stretchable and less compressible than the substrate. The diode layer and the electrodes will typically break at an elongation below <1%. E.g. typically either the top electrode or the bottom electrode is made of a brittle material such as ITO and it is well known that ITO will fracture at even small elongation.

The light emitting transducer is stretchable and compressible in one or more directions due to the design of the top substrate surface and the substrate material, because at least a few of the layers are neither stretchable nor compressible when compared to substrate material.

The layers have a thickness in the order of nm and this enables the layers to be bendable. The layers are deposited on the microscale pattern of a plurality of raised and depressed surface portions and therefore the areas of the layers are larger than the bottom substrate surface.

The substrate is flexible and the above mentioned characteristics enable the transducer to be both stretchable and compressible in one or more directions even though a few of the layers are neither.

When the light emitting transducer is stretched the substrate is stretched, but the layers are not. The pattern of a plurality of raised and depressed surface portions changes form, so that the amplitude of the plurality of repeating raised and depressed surface portions is decreased while the period is increased in the stretching direction.

Thus, the layers are not stretched, but the bending of the layers is decreased as the layers are made more flat.

The transducer may be stretched by 20-25% of the transducers length without introducing lifetime destroying defects.

When the light emitting transducer is compressed the substrate is compressed, but the layers are not. The pattern of a plurality of raised and depressed surface portions changes form, so that the amplitude of the plurality of repeating raised and depressed surface portions is increased while the period is decreased in the compression direction.

Thus, the layers are not stretched; they are bent more.

The above described property makes the transducer compliant in certain direction defined by the pattern of the repeated raised and depressed surface portions. The compliancy makes the transducer able to withstand external and internal induced stresses.

The skilled person would recognize that the surface pattern determines in which directions the light emitting transducer may be compressed and/or stretched; it is in those directions where the non-compressible and non-stretchable layers may change their degree of bending.

Thus, it is possible to attach the light emitting transducer to a surface having a shape which varies over time, by way of example due to environmental factors, such as changes in temperature, changes in moisture level, vibrations, shock, etc. Since the flexible properties of the light emitting transducer allows it to follow such changes in shape of the surface having the light emitting transducer attached thereto, it is prevented that such changes causes damage to the light emitting transducer, by way of example in the form of cracks, fractures or tension, and the lifetime of the transducer may thereby be prolonged.

Furthermore, the flexible characteristics of the transducer makes it possible to attach the transducer to surfaces of various shapes, by way of example curved surfaces, even double curved surfaces.

The transducer according to an aspect may be provided such that said surface pattern comprises waves forming troughs and crests extending essentially in one common direction, each wave defining a height being a shortest distance between a crest and neighbouring troughs. According to this embodiment, the surface pattern enables the layers to be bendable along one bendable direction, while the surface pattern does not enable the layers to be bendable along a direction being substantially perpendicular to the bendable direction. Thus, the waves define an anisotropic characteristic facilitating movement in a direction which is perpendicular to the common direction. According to this embodiment, the crests and troughs resemble standing waves with essentially parallel wave fronts.

However, the waves are not necessarily sinusoidal, but could have any suitable shape as long as crests and troughs are defined. According to this embodiment a crest (or a trough) will define substantially linear contour-lines, i.e. lines along a portion of the corrugation with equal height relative to the substrate in general. This at least substantially linear line will be at least substantially parallel to similar contour lines formed by other crest and troughs, and the directions of the at least substantially linear lines define the common direction. The common direction defined in this manner has the consequence that anisotropy occurs, and that flexibility of the transducer in a direction perpendicular to the common direction is facilitated, i.e. the transducer is flexible in a direction perpendicular to the common direction. As a consequence, the transducer can be attached to a curved surface without introducing cracks or creases in the transducer, because the transducer is capable of stretching and/or compressing along the direction in which the layers may change the bending radii.

As an alternative, the surface pattern may comprise waves forming troughs and crests extending essentially in at least two directions along the surface of the substrate. According to this embodiment, the layers may change their degree of bending and thereby the transducer is stretchable, along at least two directions.

As a consequence, it is possible to attach the light emitting transducer to a true 3D structure without introducing cracks or creases in the transducer, since the transducer is capable of stretching along the two compliant directions. Thereby it is possible to attach the light emitting transducer to a large variety of different kinds of surfaces, such as cars or other vehicles, clothing, sports equipment, facades of buildings, etc. It is even possible to attach the transducer to a surface, which changes shape over time.

According to one embodiment, the surface pattern may comprise waves forming troughs and crests, said troughs and crests defining wave fronts extending essentially in at least two directions along the surface of the substrate. Thus, according to this embodiment, the surface pattern comprises crests similar to hilltops, the hilltops being arranged on the surface in such a manner that substantially parallel lines can be drawn between groups of neighbouring hilltops, the parallel lines defining wave fronts. Such wave fronts are defined along at least two directions along the surface of the substrate, e.g. along two directions arranged substantially perpendicularly to each other, or along three directions arranged with a mutual angle of approximately 120°. Accordingly, similarly to what is described above, the transducer is in this case flexible along at least two directions, i.e. the directions defined by the extension of the wave fronts, and the transducer can thereby be attached to double curved surfaces as described above.

The light emitting transducer may have a radius of curvature in the order of mm without introducing lifetime destroying defects.

In an aspect, the light emitting diode layer comprises one or more organic diodes. The person skilled in the art would be able to find and buy the suitable organic materials from a company such as Lumtec.

The organic diode may have a thickness between 20-400 nm, 60-200 nm.

The organic diode may comprise of one or more organic layers.

In an aspect, the light emitting diode layer may comprise one or more inorganic semiconductor diodes. The light emitting diode material may be GaAs or GaN or $GaAl_{1-x}As_x$ or InGaN or any other semiconductor material capable of producing light in the visible spectrum. The semiconductor diode may have a thickness between 5-200 nm, 50-100 nm.

In an aspect, the one or more organic diodes are polymer diodes. The polymer diode may be based on PPV. The polymer diode may have a thickness between 20-400 nm, 60-200 nm.

In an aspect, the diode layer may comprise one or more quantum dots.

The diode layer of quantum dots may have a thickness between 5-200 nm, 50-100 nm.

In an aspect, the top electrode is transparent. In this embodiment the transducer is a top emitter as the light will be emitted from the top side of the transducer.

The top electrode may be a transparent conductive electrode (TCO) being of the oxidic types such as ITO or AlZO or SnZO or a transparent metallic electrode (TME).

In an embodiment the bottom electrode is a metallic contact, which will work as a reflector of the generated light thereby increasing the light emitted from the top side.

In an aspect, the bottom electrode and the substrate are transparent.

In this embodiment the transducer is a bottom emitter as the light will be emitted from the bottom side of the transducer, which is possible due to the substrate and the bottom electrode being transparent.

The bottom electrode may be a transparent conductive electrode (TCO) being of the oxidic types such as ITO or AlZO or SnZO or a transparent metallic electrode (TME).

In an embodiment the substrate is a transparent silicone substrate. The deposition of the TCO layer is done at a relatively high temperature, but it makes no harm to the silicone substrate, which will show no degradation at processing temperatures up to 150° C. and limited degradation when in short time exposed to up to 250° C.

In an embodiment the top electrode is a metallic contact, which will work as a reflector of the generated light thereby increasing the light emitted from the bottom side.

In an aspect, the bottom electrode, the top electrode and the substrate are transparent. In this embodiment the transducer is a top and bottom emitter, while being transparent.

In an aspect, the transducer further comprises a bottom smoothing layer between the substrate and the bottom electrode.

The substrate has a pattern of raised and depressed micro-scale surface portions, which has a positive effect on the transducer. However, the top substrate surface will have defects such as nanoscale hairs and/or nanoscale sharp edges extending from the surface due to the moulding of the substrate top surface. These nanoscale hairs and/or nanoscale sharp edges are unwanted as they reduce the quality of the transducer.

In an embodiment the nanoscale hairs and other surface defects are removed by plasma treating the substrate top surface in an argon atmosphere. This will make the top substrate surface smoother and if the substrate is silicone-based then it will lead to the formation of a thin $SiO_x$-layer having a thickness of 5-100 nm. This $SiO_x$-layer has a triple function; it works as a smoothing layer and as an encapsulating layer which isolates the light emitting diode from the ambient atmosphere. This is particularly important for OLEDs as moisture and oxygen are damaging to the function. Furthermore, the $SiO_x$-layer works as an adhesive layer, which will improve the connection between the bottom electrode and the substrate. The thickness of the smoothing layer will enable the layer to bend.

In an embodiment a $TiO_2$-layer is deposited on the top substrate surface after the plasma treatment. The $TiO_2$-layer will like the $SiO_x$ layer have three positive effects. It will work as a smoothing layer and as an encapsulating layer which isolates the light emitting diode from the ambient atmosphere. This is particularly important for OLEDs as moisture and oxygen are damaging to the function. Furthermore, the $TiO_2$-layer works as an adhesive layer, which will improve the connection between the bottom electrode and the substrate. The thickness of the smoothing layer will enable the layer to bend.

In an aspect, the transducer further comprises a bottom encapsulating layer between the smoothing layer and the bottom electrode.

In another embodiment an extra encapsulation layer being either oxide or nitride or oxi-nitride would be deposited on the $SiO_x$-layer as it will further isolate the light emitting diode from the ambient atmosphere, thereby extending the lifetime of the transducer. The thickness of the layer is 5-100 nm. The thickness of the encapsulation layer will enable the layer to bend.

In another embodiment the nanoscale hairs and other surface defects may be covered by depositing a nitride thin film or an oxide thin film. The thickness of the layer is 5-100 nm. The thickness of the encapsulation layer will enable the layer to bend. The bending radii would be in the order of mm.

In an aspect, the transducer further comprises a top encapsulating layer above the top electrode. The top encapsulating layer may be a nitride thin film or an oxide thin film. The skilled person would know which thin film to deposit based upon the wanted layers. The thickness of the layer is 5-200 nm, 20-100 nm. The thickness of the encapsulation layer will enable the layer to bend. The bending radii would be in the order of mm.

In an aspect, the transducer may further comprise a bottom encapsulating layer below the bottom electrode and above the substrate. The bottom encapsulating layer may be a nitride thin film or an oxide thin film. The skilled person would know which thin film to deposit based upon the wanted layers. The thickness of the layer is 5-200 nm, 20-100 nm. This will further increase the lifetime of the transducer, which would be better isolated from the ambient atmosphere. The thickness of the encapsulation layer will enable the layer to bend. The bending radii would be in the order of mm.

In an aspect, the top electrode comprises of a conductive polymer.

The conductive polymer may be materials such as PEDOT or PEDOT:PSS (poly(3,4-ethylenedioxythiophene) polystyrene sulfonate) or conductive silicone blends. The conductive polymer has a conductivity which is about a million times smaller than metal, but the thickness of the polymer will typically be 0.2-10 µm or 0.5-5 µm or 1-2 µm.

The conductive polymer will due to the production method have a planar top electrode surface, which allows the front protection layer to be flat. This enables application where the transducer is mounted on a planar surface of a device or a 2.5D surface of a device or a 3D surface of a device. This may be done by laminating the top surface of the front protection layer onto the surface of a device. The planar top side makes for a robust and easy to laminate transducer. The PEDOT layer will make the transducer less flexible compared to a transducer not having a PEDOT layer. However, the transducer will still be able to be mounted on a planar surface of a device or a 2.5D surface of a device or a 3D surface of a device as long as the curvature is not too great.

One of the benefits of conductive polymers is that they are easy to handle as they can be cured by heating the conductive polymer to a temperature above 80° C., which is non-damaging to the transducer.

In an aspect, the top electrode may further comprise a metallic electrode between the conductive polymer and diode layer.

The combination of a metallic electrode and a conductive polymer is defined as a composite electrode. The composite electrode brings two enhancements of the transducer performance. First it brings a more robust electrode where loss of conduction related to potential cracks in the rather brittle electrode is reduced due to the conductive polymer electrode making short-circuits across the cracks. Secondly with the composite electrode it is easier to make an electrical connection to the diode.

In an aspect, the pattern is repeated with a period between 100-1000 mm.

Advantageously the pattern is created using a roll as a mask. This mask may have a circumference of 100-1000 mm, 200-600 mm or 300-400 mm.

This will enable transducer to be produced in a roll-to-roll process, which will keep the manufacturing cost down.

In an aspect, the raised and depressed surface portions are randomly distributed on a micrometre scale. By having a randomly formed surface, the light will escape in a diffuse way suitable for creating a subtle lighting element ideal for providing a luminescent layer and avoiding diffractive grading effects from linear periodic patterns. The surface is randomly formed on the micro-scale, however repeating on the larger mm/cm scale. This may be done by using a roll.

In an aspect, the pattern is orderly formed. From a given orderly formed surface, the light will escape in an orderly predetermined manner, e.g. directing the light emittance in given directions and by that performing as a light processing surface such as providing diffractive optical effects, structural coloration or holographic coloration.

In some embodiments the orderly pattern may be used to detect the compression or stretching of a structure by attaching the transducer to the surface of the structure. If the structure changes shape the diffractive optical effects, structural coloration or holographic coloration of the transducer will also change.

In an embodiment the bottom substrate surface is matte. The matte surface will ensure that the emitted light from the transducer is diffused light, and interference patterns, structural coloration, holographic colorations and iridescence is reduced or avoided.

In an embodiment the bottom substrate surface is smooth. The smooth surface will ensure that the emitted light from the transducer is direct light, which will enable interference patterns, structural coloration, holographic colorations and iridescence.

In an aspect, the bottom substrate surface is a lens.

The lens may be a concave or convex or a Fresnel lens.

The flexibility of the transducer will allow the lens to change dimensions in a controlled way, so that the optical characteristics is changed, e.g. enabling variable focus length or variations in the direction of emitted light.

In an aspect, the light emitting transducer is mounted on a silicone lens.

The lens may be a concave or convex or a Fresnel lens. The lens may have other shapes. The flexibility of the transducer will allow the lens to change dimensions in a controlled way, so that the optical characteristics is changed, e.g. enabling variable focus length or variations in the direction of emitted light In an aspect, the layers and the electrodes above the substrate has a thickness, which is $\frac{1}{50}$ to $\frac{1}{100}$ of a height difference between the repeating raised and depressed micro-scale surface portions. The above mentioned proportions are important as it enables the transducer to be stretched or compressed in the compliant directions without introduction of lifetime destroying defects.

In an embodiment transducer may have two or more wave fronts and the height difference along a line perpendicular to the wave fronts may be different. This will affect the transducer as the stretchability will decrease if the height difference decreases. Thus, transducer may be more or less compliant in certain directions depending on the height difference of the repeating raised and depressed surface portions in those directions.

In an aspect, the repeating raised and depressed micro-scale surface portions has a height difference of 5-50 µm.

The light emitting transducer can be mounted in various ways, when applied as a lighting device. The transducer may be mounted as a curtain, connected electrically and mechanically along only the one side of a sheet of film. In this configuration the flexible stretchable film brings lighting device with the design expression like a curtain.

The light emitting transducer may be mounted as a sheet of film in a frame, connected mechanically along all sides to a mechanically stable frame and connected electrically along one or more sides. The frame can be made of a stable stiff material and the LED/OLED/PLED film is in a planar or non-planar geometry. The frame can be integrated part of a textile or similar flexible nature, and in this configuration the lighting device has the design expression of a wearable clothes with the integrated feature of emitting light The light emitting transducer may be mounted on a flat 2D or curved 2½ D solid surface. In this configuration the rear flat surface of the substrate is laminated to the flat 2D or curved 2½ D surface and the lighting device has the design expression of the 2D or curved 2½ D surface. The flexibility and stretchability of the LED/OLED/PLED film allows for the film to adapt to the 2D or curved 2½ D during mounting and lamination of the film to the surface, however also allows for the part (with the 2D or curved 2½ D) to change shape due to applied forces/stresses or applied change of temperature.

The light emitting transducer may be mounted on a 3D solid surface. In this configuration the rear flat surface of the substrate is laminated to the full 3D surface and the lighting device has the design expression of the full 3D surface. The flexibility and stretchability of the LED/OLED/PLED film allows for the film to adapt to the 3D surface during mounting and lamination of the film to the surface, however also allows for the part (with full 3D shapes) to change shape due to applied forces/stresses or applied change of temperature.

In an aspect, the substrate is an optical element. The substrate as an optical element can be used to focus and/or control the light emitted by the light emitting transducer. The optical element may be planar, concave or convex. The optical element may have a Fresnel lens structure.

On way of making the substrate into an optical element is by merging the substrate of the transducer with an optical element being of the same material as the substrate. The transducer and the optical element can be merged by first heating the transducer and the optical element followed by an act of pressing the two components together. In this way the transition from the substrate to the optical element is so good with regards to the optical characteristics (constant refractive index) that the substrate may be seen as a single optical element.

In an aspect, the bottom substrate surface is a lens, the lens can be used to focus and/or control the light emitted by the transducer. The bottom substrate surface may be planar, concave or convex. The lens may have a Fresnel lens structure on the bottom substrate surface.

In an aspect, the transducer may be mounted on a silicone lens. The light emitted by the transducer can be controlled by the lens. Each side of the lens may be planar, concave, convex or Fresnel.

When mounting the flexible transducer on a silicone lens the flexibility of the transducer may allow the lens to change dimensions in a controlled way, so that the optical characteristics is changeable, e.g. enabling variable focus length or variations in the direction of emitted light.

An optical element may have a first surface and a second surface and in between a silicone material. A transducer is attached to one surface.

The optical element may control pathway of light moving towards and/or from the transducer.

The optical element may be a silicone lens, which like the transducer is flexible. When mounting the flexible transducer on a silicone lens the flexibility of the transducer may allow the lens to change dimensions in a controlled way, so that the optical characteristics is changeable, e.g. enabling variable focus length or variations in the pathway of electromagnetic waves.

The transducer may be a solar cell and/or a thermoelectric transducer.

The transducer may be a light-emitting transducer.

The light-emitting transducer may comprise of one or more organic diodes or one or more semiconductor diodes or one or more polymer diodes or one or more quantum dots or a combination of the previous mentioned types.

In an aspect, the light emitting diode layer may comprise a plurality of diodes. This will increase the usability of the transducer as it can be used as a simple lighting device, but the plurality of diodes enables the transducer to be used as a display.

A suitable top substrate surface will enable the display to bendable in two directions at the same time, thereby gaining a true 3D structure.

The display would also be foldable. In an embodiment the plurality of diodes are controlled by a passive matrix as the passive matrix is easier and thereby cheaper to make.

In an embodiment the plurality of diodes are controlled by an active matrix. The active matrix gives a greater control over each diode.

In an embodiment the transducer may have three different types of diodes, where each type have different emission spectrums such as red, green and blue. This enables the transducer to produce different colours and white light.

In an embodiment the different diodes of the transducer may have different sizes in order to compensate for different effects such as quantum efficiency or degradation due to drive current density.

In an aspect, the light emitting transducer may further comprise a TFT-array having a plurality of interconnected thin-film transistors, each thin-film transistor being near a diode of the plurality of diodes.

The thin-film transistor (TFT) array will enable each diode to be controlled by a control unit. The control unit may switch the diode on/off or control the light intensity.

The TFT will behave like the other electrodes when the transducer is stretched in directions defined by the surface pattern. If the top substrate surface pattern enables the transducer to be stretchable and compressible in two directions, then the transducer having a TFT-array would be a display capable of bending in two directions, i.e. a true 3D structure.

In an embodiment the TFT-array is positioned above the top electrode and connected to the top electrode. If the light emitting transducer is a bottom emitter the TFT-array will be positioned above the top electrode in order to minimise the interaction with the emitted light.

In an embodiment the TFT-array is below the bottom electrode and connected to the bottom electrode. If the light emitting transducer is a top emitter the TFT-array will be positioned below the bottom electrode in order to minimise the interaction with the emitted light.

In an embodiment the light emitting diode layer has an isolation element in between neighbouring diodes. The isolation element will minimise cross-talk between neighbouring diodes, which will increase the quality of the display.

In an embodiment adjacent diodes are grouped in emission groups, where each emission group is capable of producing white light. The individual diodes may have different emission spectrums such as red, green and blue or any other combination where the addition of the individual spectrums sums to white light. The subpixels of the emission group may then be controlled by the TFT-array to produce the different colours in the visible spectrum.

In an embodiment the plurality of diodes comprises at least one diode emitting white light. In order to give a sufficient light intensity the display may have at least one diode producing white light. The white light emitting diodes could be phosphor-coated LEDs or stacked organic diodes.

In an embodiment the plurality of diodes are stacked organic diodes, which comprises two or more light emitting organic layers.

In an embodiment the stacked organic diodes produce white light, which enables the transducer to be used as a white light source. Together with the design of the light emitting transducer this makes it possible to place the light emitting transducer on curved or double curved surfaces, thus the usability is greatly enhanced.

In an embodiment neighbouring stacked organic diodes are grouped in colour groups comprising at least three stacked organic diodes. The stacked organic diodes in the colour group may be controlled individually.

In an embodiment the transducer further comprises a colour mask being positioned below the bottom electrode. If the transducer is a bottom emitter the colour mask will be positioned below the bottom electrode.

The colour mask may have three different colour filters such as red, green and blue, as it will enable the colour group to produce the colours of the visible spectrum. The colour mask could have a different number of filters and different kinds.

The colour mask may have a transparent filter, which can be used to increase the light intensity. The colour mask is aligned with the stacked organic diodes, such that each filter in the colour mask will filter the light of a single stacked organic diode. This design will make the production of the diode layer simpler as all the stacked organic diodes are similar.

In an embodiment the transducer further comprises a colour mask being positioned above the top electrode. If the transducer is a top emitter the colour mask will be positioned above the top electrode.

The colour mask may have three different colour filters such as red, green and blue, as it will enable the colour group to produce the colours of the visible spectrum. The colour mask could have a different number of filters and different kinds. The colour mask may have a transparent filter, which can be used to increase the light intensity. The colour mask is aligned with the stacked organic diodes, such that each filter in the colour mask will filter the light of a single stacked organic diode. This design will make the production of the diode layer simpler as all the stacked organic diodes are similar.

In an aspect, the thin-film transistors are organic thin-film transistors as it is possible to deposit the organic thin-film transistors at a temperature of around 150° C. The silicone substrate will degrade at higher temperatures such as 250° C., thus to avoid degradation the TFT-array has to be deposited at low temperature.

In an aspect, the thin-film transistors are oxide thin-film transistors (Such as IGZO) as it is possible to deposit the oxide thin-film transistors at a temperature of around 150° C. The silicone substrate will degrade at temperatures above 150° C., thus to avoid degradation the TFT-array has to be deposited at low temperature.

In an aspect, the thin-film transistors are nitride thin-film transistors, such as GaN, which can be deposited at a temperature of 250° C.

A method for production of a transducer for use as a display may comprise one or more of the following acts.

There may be an act of providing a stretchable and compressible substrate having a bottom substrate surface and a top substrate surface with a surface pattern of a plurality of repeating raised and depressed micro-scale surface portions which extend in at least one direction.

In an embodiment the substrate having the top substrate surface with the surface pattern of a plurality of repeating raised and depressed micro-scale surface portions is made in a slot die coating process.

In an embodiment the substrate having the top substrate surface with the surface pattern of a plurality of repeating raised and depressed micro-scale surface portions is made in a hot embossing process.

The micro-structured surface portions may have a period in the range of 5-10 µm and an amplitude of up to the period i.e. up to 5-10 µm.

In another embodiment the micro-structured surface portions may have a period in the range of 2-5 µm and an amplitude of up to the period i.e. up to 2-5 µm.

There may be an act of adhering the bottom substrate surface to a gas-permeable carrier for prevention of substrate movements.

The acts of depositing several layers at several stations on a stretchable polymer substrate rely heavily on the ability to get the correct alignment of the mask and substrate.

Thus, it is important that all surface portions of the substrate are in the same relaxed state and at same position on the carrier at all times.

When working with a flexible substrate the substrate may also change shape due to forces related to changes in temperature.

The flexible substrate is secured by adhering the planar bottom substrate surface to the top course of the carrier. This may be done by making the surface of the carrier sticky or by making the planar bottom substrate surface sticky.

The carrier is gas-permeable, which allows small pockets of otherwise trapped gas between the carrier and the substrate to escape the pockets when subjecting the substrate to vacuum conditions.

In an embodiment the carrier is a perforate steel plate. The perforate steel plate will allow the gas to escape through the bottom of the holes. The surface of the steel plate may be coated with a sticky material, which enables the substrate to be adhered to the surface of the steel plate.

If the substrate moves or parts of the substrate move the alignment between the plurality of masks and the structures on the substrate changes, this misalignment will cause the transducer or parts of the transducer to be non-working.

The alignment of the mask with the substrate is in particular critical, when depositing the oxide diode or the oxide-TFT layer due to the smaller size of the structures and the surface pattern on the top substrate surface.

Thus, the adhering enables the production of an OLED transducer capable of functioning as a flexible display.

In another embodiment the carrier may be cooled. This will increase the cooling of the substrate, which should not be subjected to temperatures above 250° C. and should only for brief periods of time be subjected to temperatures above 150° C. Some of the acts of depositing will be at temperatures above the 250° C. limit, but the cooling will keep the substrate below the 250° C. limit. Thus, the quality of the light emitting transducer is increased by the cooling as the substrate will suffer degradation to a lesser extent.

If the substrate is not cooled through the carrier, each act of depositing material will be divided into smaller steps of depositing followed by a time step, where the substrate will cool passively. Thus, the carrier cooling will also decrease the production time.

In an embodiment the carrier is cooled to a temperature of 20-30° C.

There may be an act of plasma treating the top substrate surface. The plasma treatment may be in an argon/oxygen atmosphere. The plasma treatment will make the micro-scale surface portions smoother as there may be unwanted surface elements, such as nano-scale hairs and nano-scale edges, which will lower the quality of the light emitting transducer if not removed.

In an embodiment the substrate is silicone or silicone-based and if this substrate is plasma treated then the top substrate surface will form a thin $SiO_x$ layer, which may further function as an encapsulation layer isolating the organic material from the ambient atmosphere containing oxygen and moisture.

There will be repeated acts of placing shadow masks above the top substrate surface, wherein each shadow mask has a design suitable for a specific deposition step. The openings will have edge to edge distances, which are shorter compared to the desired structures of the deposited material.

The surface pattern complicates the deposition of material; because the surface pattern prohibits the shadow mask from making a perfect clamp on the uppermost surface. The depressed surface portions will leave openings in between the shadow mask and the uppermost surface. This will cause shadow effects, wherein material will be deposited outside the openings defined by the shadow mask. Thus, the shadow effects will perturb the deposition of material when using a shadow mask having under-dimensioned openings, such that the deposited material has the desired structure.

Studies have shown that the period of the raised and depressed surface portions have an impact on the maximum extend of the shadow effects.

Assuming one nominal dimension of a pixel of the active layer to be 0.085 mm (corresponding approximately 300 pixels/inch) and assuming the period of the depressed and raised surface portions is approximately 0.005 mm, then the distance edge to edge of the opening in the mask should be reduced by approximately 0.0025 mm (½ period) to 0.0825 mm. Depending on the deposition process used the tolerances on the dimension edge to edge of the pixel should be expected to increase by a maximum 0.0025 mm.

Furthermore, the size of these shadow effects is in the same order of magnitude as the tolerance on the edge to edge distance of the openings.

There will be repeated acts of removing said shadow mask after deposition.

There may be an act of depositing a transparent bottom electrode on the top substrate surface.

The bottom electrode may be deposited by PVD techniques in an argon atmosphere.

The bottom electrode may be deposited by bipolar MF sputtering in an argon atmosphere.

The bottom electrode may be deposited by RF sputtering in an argon atmosphere.

The bottom electrode may be deposited by CVD or PECVD in an argon atmosphere.

The transparent bottom electrode will cover most of the top substrate surface in order to get a good contact with the next oxide layer.

In an embodiment the transparent electrode is an ITO electrode. The work function of ITO is almost as large as HOMO of the organic material, thus the ITO is particular suitable for injection of holes into the organic layer; i.e. it may function as an anode.

There may be an act of depositing a colour group of organic pixels on the bottom electrode comprising one or more steps of depositing organic layers on top of each other. The organic pixels in a colour group will have similar emission spectrums.

A classic RGB-display will therefore have three colour groups; however a display may have any number of colour groups.

Furthermore, the size of the pixels of the different colour groups may have different sizes as the organic material used in the different colour groups may have different properties regarding emission efficiency and current density degradation.

In an embodiment the organic layers are deposited using vacuum thermal evaporation technique.

In an embodiment a hole injection layer may be deposited onto the ITO as it will help the injection of holes from the ITO layer to the organic layer. This may be followed by an act of deposition of a hole transport layer for transportations of holes. This may be followed by an emitting layer, where electrons and holes will recombine while emitting light.

In an embodiment the organic pixels may further comprise an electron transport layer on the emitting layer.

There may be an act of depositing a TFT-layer comprising one or more steps of depositing conductive electrodes, insulation layers, thin-film transistors.

The thin-film transistors may be oxide or organic as they can be deposited at temperatures, which will not degrade the substrate or will only degrade the substrate slightly. The deposition of the TFT-layer may be done by a combined set of PVD, CVD and PECVD processes.

The conductive electrodes deposited will be the data and gate lines. Depending on the surface pattern the electrodes may have to be deposited in certain direction.

In an embodiment the substrate may have a surface pattern having a plurality of wave fronts in one common direction; similar to FIG. 11. In this embodiment the conductive electrodes must be deposited in a direction perpendicular to the wave fronts as they would otherwise break at a short elongation when the transducer is stretched.

In an embodiment the substrate may have a surface pattern having a superposition of at least two wave fronts; similar to FIG. 12. In this embodiment the conductive electrodes can be deposited in an arbitrary direction relative to the wave fronts as the electrodes will not break when the transducer is stretched and/or compressed.

The oxide thin-film transistor may be of IGZO type. IGZO may be deposit at a temperature of 150° C., which the substrate may be subjected for a time without severe degradation.

In an embodiment the isolation layers are made of silicon oxide ($SiO_2$), aluminium oxide ($Al_2O_3$), $SiO_2$ doped with boron or phosphorous or organic layers such as parylene (pply(p-xylylene)).

There may be an act of depositing a top electrode on the organic pixels. The metallic top electrode may be deposited by PVD-techniques.

The PVD-technique could be DC-sputtering.

The PVD-technique could be pulsed DC sputtering.

The PVD-technique could be bipolar MF.

The PVD-technique could be high power impulse magnetron sputtering.

In an embodiment the top electrode comprises of a single Al layer. Aluminium has a work function similar to the HOMO level of the organic layer and this makes aluminium a good electron injector.

The top electrode may comprise of a LiF layer in contact with the organic layer for better injection of electrons into the organic layer. On top of the LiF there may be Al layer.

There may be an act of depositing a protective non-conductive layer. The protective non-conductive layer may be deposited by use of bipolar MF sputtering process in an atmosphere being a mix of argon, oxygen and nitrogen.

The method for producing a transducer may further comprise an act of depositing one or more encapsulation layers above said TFT-layer.

The encapsulation layer may be deposited by use of a bipolar MF sputtering process in an atmosphere of argon, oxygen and nitrogen.

The encapsulation layer is impermeable for oxygen and moisture and therefore it will increase the lifetime of the transducer. The encapsulation layer may be oxide based. The encapsulation layer may be nitride based. The encapsulation layer may be oxi-nitride based.

The method for producing a transducer may further comprise an act of depositing an encapsulation layer on the top substrate surface. The encapsulation layer may be deposited by use of a bipolar MF sputtering process in an atmosphere of argon, oxygen and nitrogen.

The substrate may be permeable for oxygen and/or moisture, thus oxygen and/or moisture will over time diffuse through the substrate towards the organic layers and this would damage the OLED. Thus, the encapsulation layer which is impermeable for oxygen and moisture will increase the lifetime of the transducer. The encapsulation layer may be oxide based. The encapsulation layer may be nitride based. The encapsulation layer may be oxi-nitride based.

There may be more than one encapsulation layers on the top substrate surface.

A method for producing a transducer for light illumination may comprise one or more of the following acts.

In an embodiment the substrate having the top substrate surface with the surface pattern of a plurality of repeating raised and depressed micro-scale surface portions is made in a slot die casting process.

In an embodiment the substrate having the top substrate surface with the surface pattern of a plurality of repeating raised and depressed micro-scale surface portions is made in a hot embossing process.

The micro-structured surface portions may have a period in the range of 5-10 µm and an amplitude of up to the period i.e. up to 5-10 µm.

In another embodiment the micro-structured surface portions may have a period in the range of 2-5 µm and an amplitude of up to the period i.e. up to 2-5 µm.

There may be an act of adhering the bottom substrate surface to a gas-permeable carrier for prevention of substrate movements.

The acts of depositing several layers at several stations on a stretchable polymer substrate rely heavily on the ability to get the correct alignment of the mask and substrate.

Thus, it is important that all surface portions of the substrate are in the same relaxed state and at same position on the carrier at all times. When working with a flexible substrate the substrate may also change shape due to forces related to changes in temperature.

The flexible substrate is secured by adhering the planar bottom substrate surface to the top course of the carrier. This may be done by making the surface of the carrier sticky or by making the planar bottom substrate surface sticky.

The carrier is gas-permeable, which allows small pockets of otherwise trapped gas between the carrier and the substrate to escape the pockets when subjecting the substrate to vacuum conditions.

In an embodiment the carrier is a perforate steel plate. The perforate steel plate will allow the gas to escape through the bottom of the holes. The surface of the steel plate may be coated with a sticky material, which enables the substrate to be adhered to the surface of the steel plate.

If the substrate moves or parts of the substrate move the alignment between the plurality of masks and the structures on the substrate changes, this misalignment will cause the transducer or parts of the transducer to be non-working. Thus, the adhering enables the production of an OLED transducer capable of functioning as a flexible light emitting device.

In another embodiment the carrier may be cooled. This will increase the cooling of the substrate, which should not be subjected to temperatures above 250° C. and should only for brief periods of time be subjected to temperatures above 150° C. Some of the acts of depositing will be at temperatures above the 250° C. limit, but the cooling will keep the substrate below the 250° C. limit. Thus, the quality of the transducer is increased by the cooling as the substrate will suffer degradation to a lesser extent.

If the substrate is not cooled through the carrier, each act of depositing material will be divided into smaller steps of depositing followed by a time step, where the substrate will cool passively. Thus, the carrier cooling will also decrease the production time.

In an embodiment the carrier is cooled to a temperature of 20-30° C.

There may be an act of plasma treating the top substrate surface. The plasma treatment may be in an argon/oxygen atmosphere. The plasma treatment will make the micro-scale surface portions smoother as there may be unwanted surface elements, such as nano-scale hairs and nano-scale edges, which will lower the quality of the transducer if not removed.

In an embodiment the substrate is silicone or silicone-based and if this substrate is plasma treated then the top substrate surface will form a thin $SiO_x$ layer, which may further function as an encapsulation layer isolating the organic material from the ambient atmosphere containing oxygen and moisture.

There will be repeated acts of placing shadow masks above the top substrate surface, wherein each shadow mask has a design suitable a specific deposition step. Each deposition will have a particular shadow mask with suitable openings. The openings will have edge to edge distances, which are shorter compared to the desired structures of the deposited material.

The surface pattern complicates the deposition of material; because the surface pattern prohibits the shadow mask from making a perfect clamp on the uppermost surface. The depressed surface portions will leave openings in between the shadow mask and the uppermost surface. This will cause shadow effects, wherein material will be deposited outside the openings defined by the shadow mask. Thus, the shadow effects will perturb the deposition of material when using a shadow mask having under-dimensioned openings, such that the deposited material has the desired structure.

Studies have shown that the period of the raised and depressed surface portions have an impact on the maximum extend of the shadow effects.

Assuming one nominal dimension of a pixel of the active layer to be 0.085 mm (corresponding approximately 300 pixels/inch) and assuming the period of the depressed and raised surface portions is approximately 0.005 mm, then the distance edge to edge of the opening in the mask should be reduced by approximately 0.0025 mm (½ period) to 0.0825 mm. Depending on the deposition process used the tolerances on the dimension edge to edge of the pixel should be expected to increase by a maximum 0.0025 mm.

Furthermore, the size of these shadow effects is in the same order of magnitude as the tolerance on the edge to edge distance of the openings.

There will be repeated acts of removing said shadow mask after deposition.

There may be an act of depositing a transparent bottom electrode on the top substrate surface. The bottom electrode may be deposited by PVD techniques in an argon atmosphere. The bottom electrode may be deposited by bipolar MF sputtering in an argon atmosphere. The bottom electrode may be deposited by RF sputtering in an argon atmosphere. The bottom electrode may be deposited by CVD or PECVD in an argon atmosphere.

The transparent bottom electrode will cover most of the top substrate surface in order to get a good contact with the next oxide layer.

In an embodiment the transparent electrode is an ITO electrode. The work function of ITO is almost as large as the HOMO level of the organic material, thus the ITO is particular suitable for injection of holes into the organic layer; i.e. it may function as an anode.

There may an act of depositing an organic layer on top of the bottom electrode, the organic layer may comprise of several organic sublayers.

In an embodiment the organic layer comprises red, green and blue organic diodes placed side by side. Each organic diode will comprise of one or more organic sublayers, which may increase the quality of the organic diodes.

In an embodiment a hole injection layer may be deposited onto the ITO as it will help the injection of holes from the ITO layer to the organic layer. This may be followed by an act of deposition of a hole transport layer for transportations of holes. This may be followed by an emitting layer, where electrons and holes will recombine while emitting light.

In an embodiment the organic layer comprises a plurality of stacked organic diodes. The stacked organic diodes will have a better luminance value compared to a non-stacked architecture.

There may be an act of depositing a top electrode on the organic pixels. The metallic top electrode may be deposited by PVD-techniques. The PVD-technique could be DC-sputtering. The PVD-technique could be pulsed DC sputtering. The PVD-technique could be bipolar MF. The PVD-technique could be high power impulse magnetron sputtering.

In an embodiment the top electrode comprises of a single Al layer. Aluminium has a work function similar to the HOMO level of the organic layer and this makes aluminium a good electron injector.

The top electrode may comprise of a LiF layer in contact with the organic layer for better injection of electrons into the organic layer. On top of the LiF there may be Al layer.

Method for producing a transducer for light illumination may further comprise one or more of the following acts;

There may be an act of depositing a protective non-conductive layer. The protective non-conductive layer may be deposited by use of bipolar MF sputtering process in an atmosphere being a mix of argon, oxygen and nitrogen.

The method for producing a transducer may further comprise an act of depositing an encapsulation layer above said top electrode.

The encapsulation layer may be deposited by use of a bipolar MF sputtering process in an atmosphere of argon, oxygen and nitrogen.

The protective non-conductive layer may be permeable for oxygen and/or moisture, thus oxygen and/or moisture will over time diffuse through the non-conductive layer towards the organic layers and this would damage the OLED. Thus, the encapsulation layer which is impermeable for oxygen and moisture will increase the lifetime of the transducer.

The encapsulation layer may be oxide based.

The encapsulation layer may be nitride based.

The encapsulation layer may be oxi-nitride based.

There may be more than one encapsulation layers above the top electrode, thereby creating a laminated structure having an even lower oxygen and moisture diffusion rate.

The method for producing a transducer may further comprise an act of depositing an encapsulation layer on the top substrate surface. The encapsulation layer may be deposited by use of a bipolar MF sputtering process in an atmosphere of argon, oxygen and nitrogen.

The substrate may be permeable for oxygen and/or moisture, thus oxygen and/or moisture will over time diffuse through the substrate towards the organic layers and this would damage the OLED. Thus, the encapsulation layer which is impermeable for oxygen and moisture will increase the lifetime of the transducer. The encapsulation layer may be oxide based. The encapsulation layer may be nitride based. The encapsulation layer may be oxi-nitride based.

There may be more than one encapsulation layers on the top substrate surface, thereby creating a laminated structure having an even lower oxygen and moisture diffusion rate.

The transducer according to one or more embodiments described herein is characterized in that said substrate is constituted by a flexible, elastic web or foil, that a front side of said substrate has a three-dimensional surface pattern of raised and depressed surface portions formed therein, said light emitting diode layer being deposited onto said three-dimensional surface pattern, that said front side electrode and rear side electrode are constituted by electric conductive layers, which comprise electric conductive materials, or which is provided with an electric conductive coatings.

A light emitting transducer includes: a flexible sheet having a bottom side and a top side, the flexible sheet including: a substrate that is stretchable and compressible, the substrate having a bottom substrate surface at the bottom side, and a top substrate surface facing towards the top side, the top substrate surface comprising a surface pattern of a plurality of raised and depressed micro-scale surface portions which extend in at least one direction; a light emitting diode layer above the substrate and conforming in shape to the top substrate surface, the light emitting diode layer corresponding with the surface pattern of the top substrate surface, wherein the light emitting diode layer has a bottom diode surface facing towards the bottom side, and a top diode surface facing towards the top side, a bottom electrode on the bottom diode surface; and a top electrode on the top diode surface.

Optionally, the light emitting diode layer comprises a plurality of diodes.

Optionally, the light emitting diode layer comprises one or more organic diodes.

Optionally, the light emitting diode layer comprises one or more inorganic semiconductor diodes.

Optionally, the one or more organic diodes are one or more polymer diodes.

Optionally, the light emitting diode layer comprises one or more quantum dots.

Optionally, the bottom electrode and the substrate are transparent.

Optionally, the top electrode is transparent.

Optionally, the light emitting transducer further includes a bottom smoothing layer between the substrate and the bottom electrode.

Optionally, the bottom smoothing layer comprises $SiO_x$.

Optionally, the light emitting transducer further includes a bottom encapsulating layer below the bottom electrode and above the substrate.

Optionally, the light emitting transducer further includes a top encapsulating layer above the top electrode.

Optionally, the bottom encapsulating layer comprises a nitride based layer or an oxide based layer or oxi-nitride based.

Optionally, the top encapsulating layer comprises a nitride based layer or an oxide based layer or oxi-nitride based.

Optionally, the top electrode comprises a conductive polymer.

Optionally, the top electrode has a planar top electrode surface.

Optionally, the top electrode further comprises a metallic electrode between the conductive polymer and the light emitting diode layer.

Optionally, the surface pattern is repeated with a period between 100-1000 mm.

Optionally, the raised and depressed micro-scale surface portions are randomly distributed on a micrometre scale.

Optionally, the surface pattern is orderly formed.

Optionally, all components of the light emitting transducer above the substrate form a thickness, which is $\frac{1}{50}$ to $\frac{1}{100}$ of a height difference between the repeating raised and depressed micro-scale surface portions.

Optionally, the raised and depressed micro-scale surface portions have a height difference of 5-50 μm.

Optionally, the light emitting transducer further includes a TFT-array having a plurality of interconnected thin-film transistors, the thin-film transistor corresponding with respective diodes at the light emitting diode layer.

Optionally, the thin-film transistors comprise organic thin-film transistors.

Optionally, the thin-film transistors comprise oxide thin-film transistors.

Optionally, the thin-film transistors comprise nitride thin film transistors.

Optionally, the thin-film transistors comprise oxi-nitride thin film transistors.

Optionally, the substrate is an optical element.

Optionally, the bottom substrate surface is a lens.

Optionally, the light emitting transducer is mounted on a silicone lens.

An optical element includes a first surface, a second surface, and a silicone material between the first surface and the second surface, wherein the optical element further comprises the transducer attached to the first surface or the second surface.

Optionally, the light emitting transducer further includes a protection layer above the top electrode, the protection layer comprising an elastic web or foil. Optionally, the light emitting diode layer is less stretchable and less compressible than the substrate.

A method for producing a light emitting transducer for light illumination includes: providing a stretchable and compressible substrate having a bottom substrate surface and a top substrate surface with a surface pattern of a plurality of raised and depressed micro-scale surface portions which extend in at least one direction; adhering the bottom substrate surface of the substrate to a gas-permeable carrier for prevention of movement of the substrate; plasma treating the top substrate surface of the substrate; placing one or more shadow masks above the top substrate surface, wherein each of the one or more shadow masks has a design suitable for a specific deposition; removing the one or more shadow masks; depositing a transparent bottom electrode on the top substrate surface; depositing an organic layer; and depositing a top electrode on the organic layer.

Optionally, the method further includes one or a combination of: depositing an encapsulation layer above the top electrode, depositing an encapsulation layer on the top substrate surface of the substrate, depositing a protective non-conductive layer.

A method for producing a light emitting transducer for a display includes: providing a stretchable and compressible substrate having a bottom substrate surface and a top substrate surface with a surface pattern of a plurality of raised and depressed micro-scale surface portions which extend in at least one direction; adhering the bottom substrate surface of the substrate to a gas-permeable carrier for prevention of movement of the substrate; plasma treating the top substrate surface of the substrate; placing one or more shadow masks above the top substrate surface, wherein each of the shadow masks has a design suitable for a specific deposition; removing the one or more shadow masks; depositing a transparent bottom electrode on the top substrate surface; depositing a colour group of organic pixels on the bottom electrode, wherein the act of depositing the colour group of organic pixels comprises depositing organic layers; depositing a top electrode on the organic pixels; and depositing an TFT-layer, wherein the act of depositing the TFT-layer comprises depositing conductive electrodes, insulation layers, and thin film transistors.

Optionally, the method further includes one or a combination of: depositing an encapsulation layer above the TFT-layer, depositing an encapsulation layer on the top substrate surface of the substrate, depositing a protective non-conductive layer.

A light emitting transducer produced by the method described herein.

Other features and advantageous will be described in the detailed description.

DESCRIPTION OF THE DRAWING

The embodiments are described in more detail with reference to the drawing, in which.

DETAILED DESCRIPTION

Figure 1:
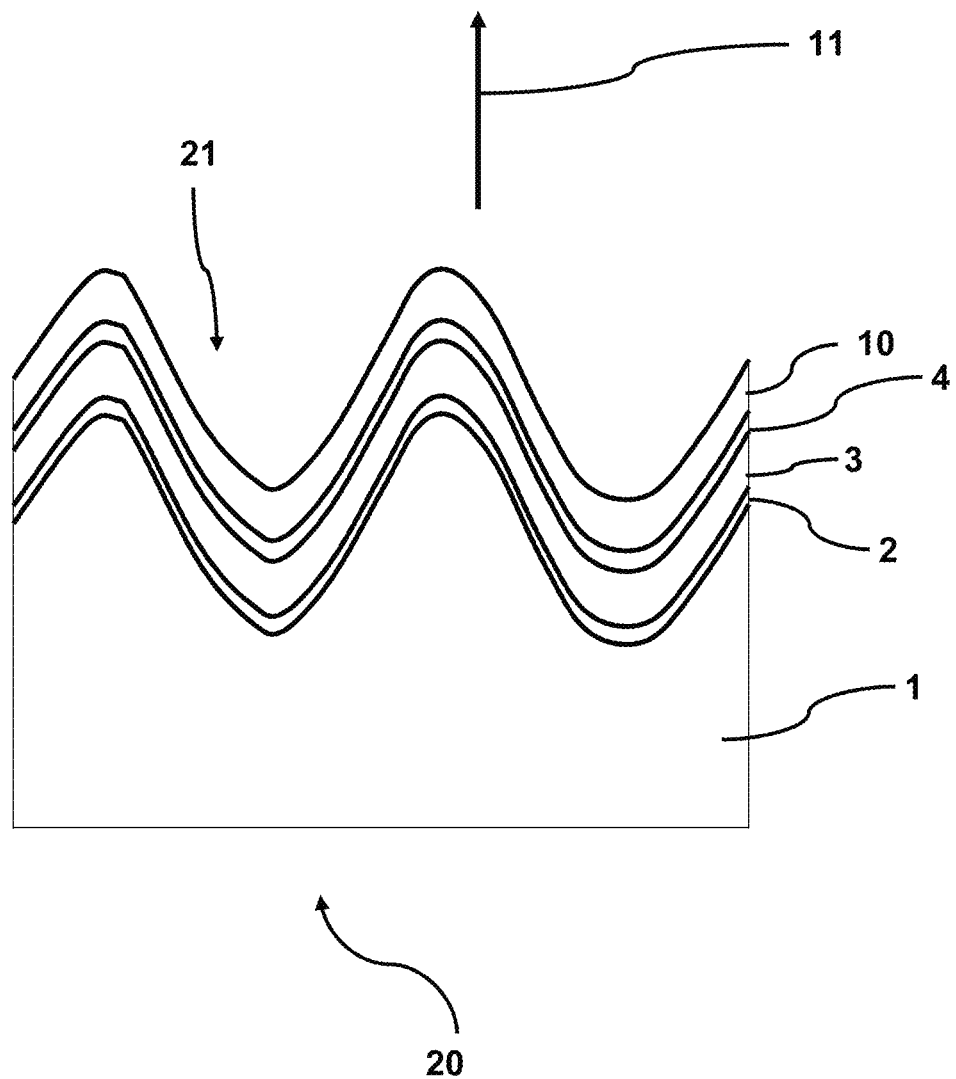
FIG. 1 illustrates a top emitter architecture.

Various embodiments are described hereinafter with reference to the figures. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages of the invention shown. An aspect or an advantage described in conjunction with a particular embodiment is not necessarily limited to that embodiment and can be practiced in any other embodiments even if not so illustrated or if not so explicitly described.

FIG. 1 illustrates a top emitter architecture, which comprises a substrate having a bottom substrate surface and a top substrate surface. The top substrate surface has a pattern of repeated raised and depressed surface portions, which extends in at least one direction.

The substrate may be made of transparent or non-transparent polymer or polymer blends.

Figure 11:
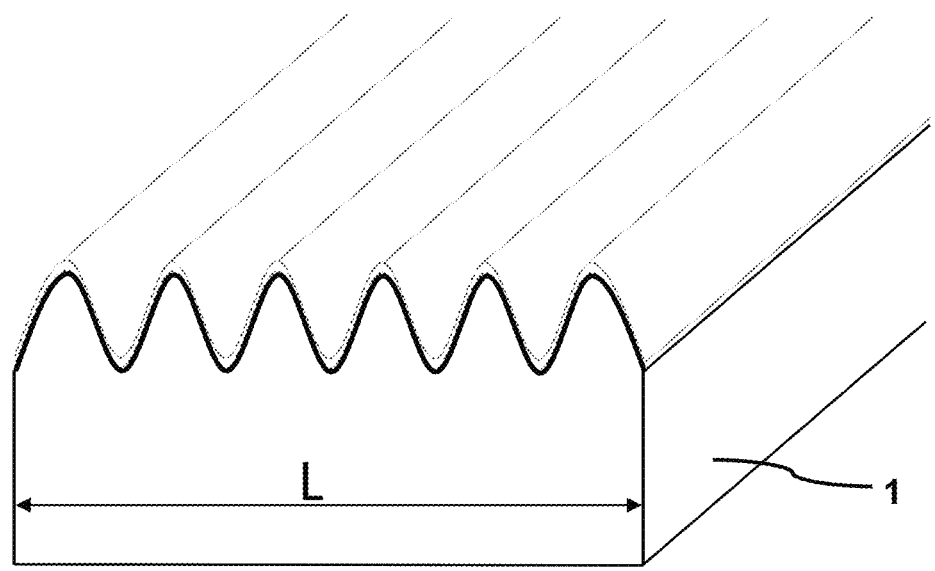
FIG. 11 illustrates the compliancy of the transducer.
Figure 11:
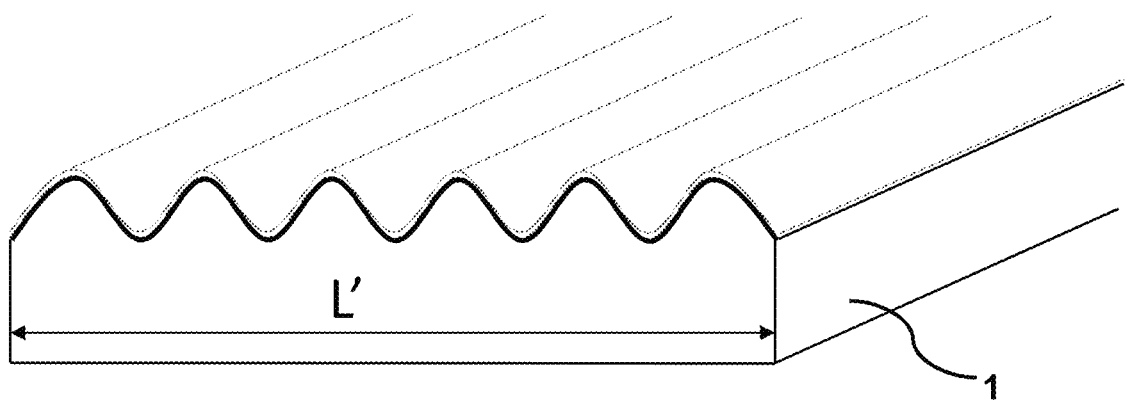
Figure 12:
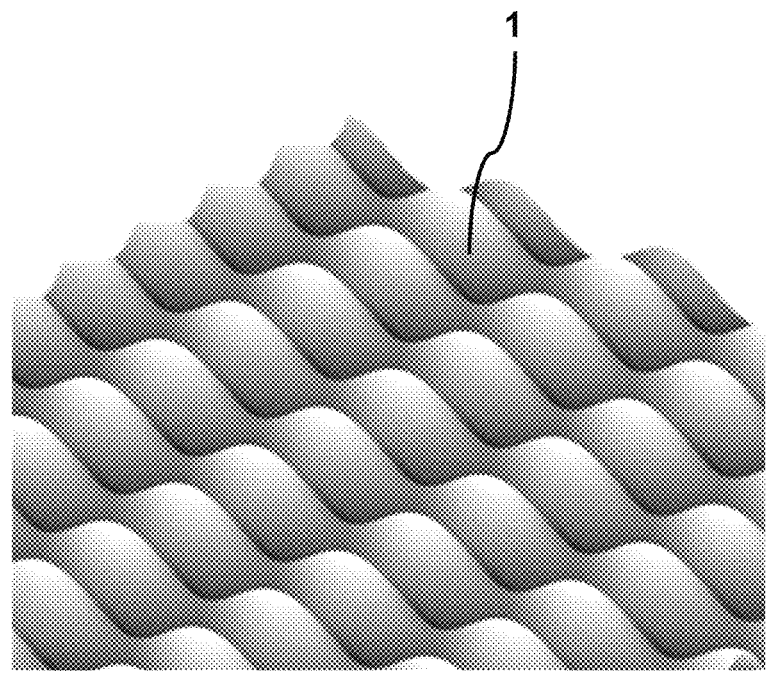
FIG. 12 illustrates two different embodiments of the top substrate surface.
Figure 12:
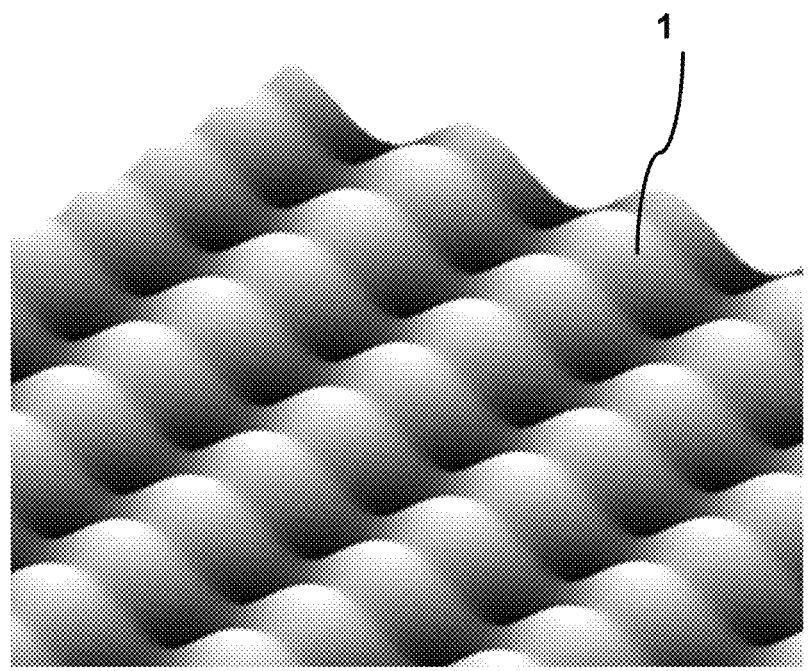

The substrate may have a design like but not limited to the disclosed surfaces in FIG. 11 or 12.

The top emitter architecture further comprises a bottom electrode positioned on the top substrate surface and conforming in shape to top substrate surface.

The bottom electrode is a metallic electrode or a transparent conductive electrode (TCO).

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A transparent top electrode of the TCO or TME type is positioned on the top diode layer surface and conforming in shape to the pattern of raised and depressed surface portions.

A transparent top protection layer is positioned on the top of the transparent top electrode and conforms in shape to the pattern of raised and depressed surface portions.

The transparent top protection layer will work as a protection prolonging the lifetime of the light emitting diode.

The top emitter architecture will emit light in a general direction indicated by the arrow 11.

Figure 2:
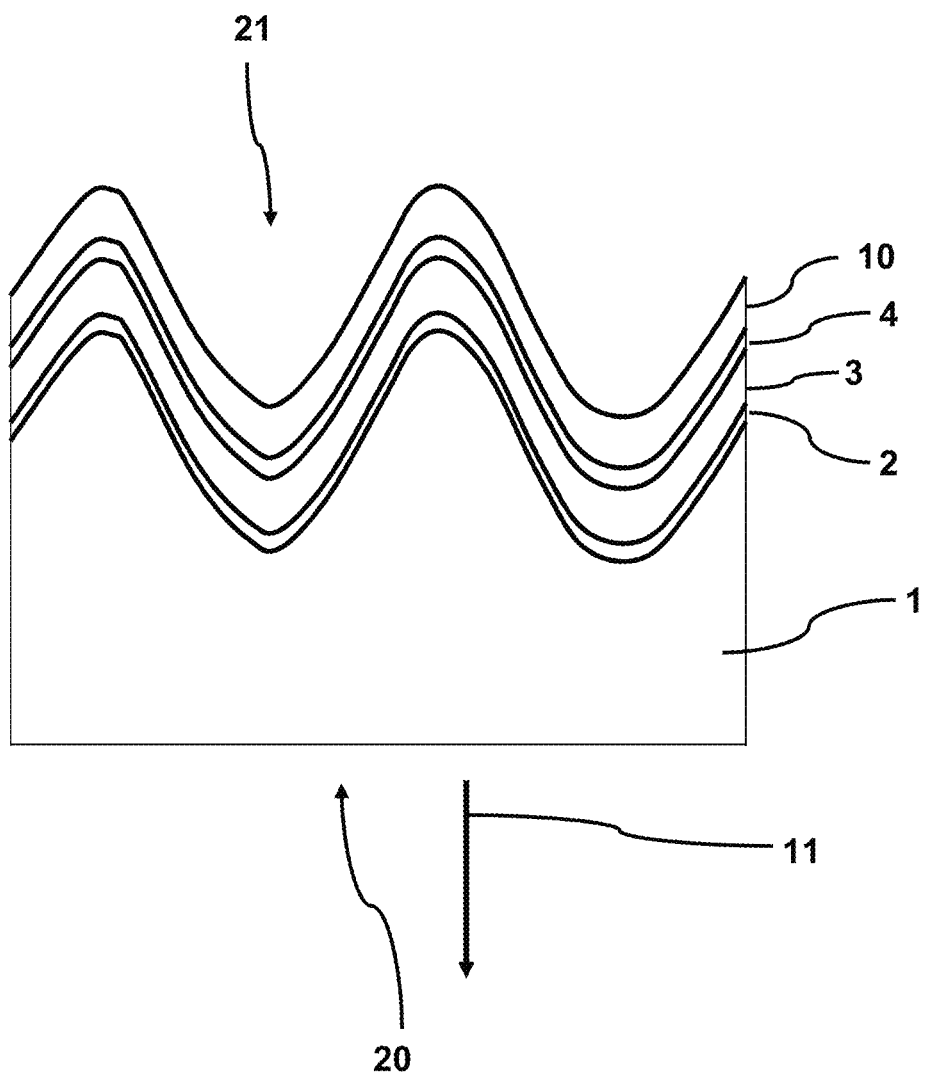
FIG. 2 illustrates a bottom emitter architecture.

FIG. 2 illustrates bottom emitter architecture, which comprises a transparent substrate having a bottom substrate surface and a top substrate surface. The top substrate surface has a pattern of repeated raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

The top emitter architecture further comprises a transparent bottom electrode positioned on the top substrate surface and conforming in shape to top substrate surface.

The transparent bottom electrode is of the TCO or TME type.

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A top electrode is positioned on the top diode layer surface and conforming in shape to the pattern of raised and depressed surface portions.

The top electrode is a metallic electrode or a transparent conductive electrode (TCO).

A top protection layer is positioned on the top of the top electrode and conforms in shape to the pattern of repeated raised and depressed surface portions.

The top protection layer will work as a protection prolonging the lifetime of the light emitting diode.

The bottom emitter architecture will emit light in a general direction indicated by the arrow 11.

Figure 3:
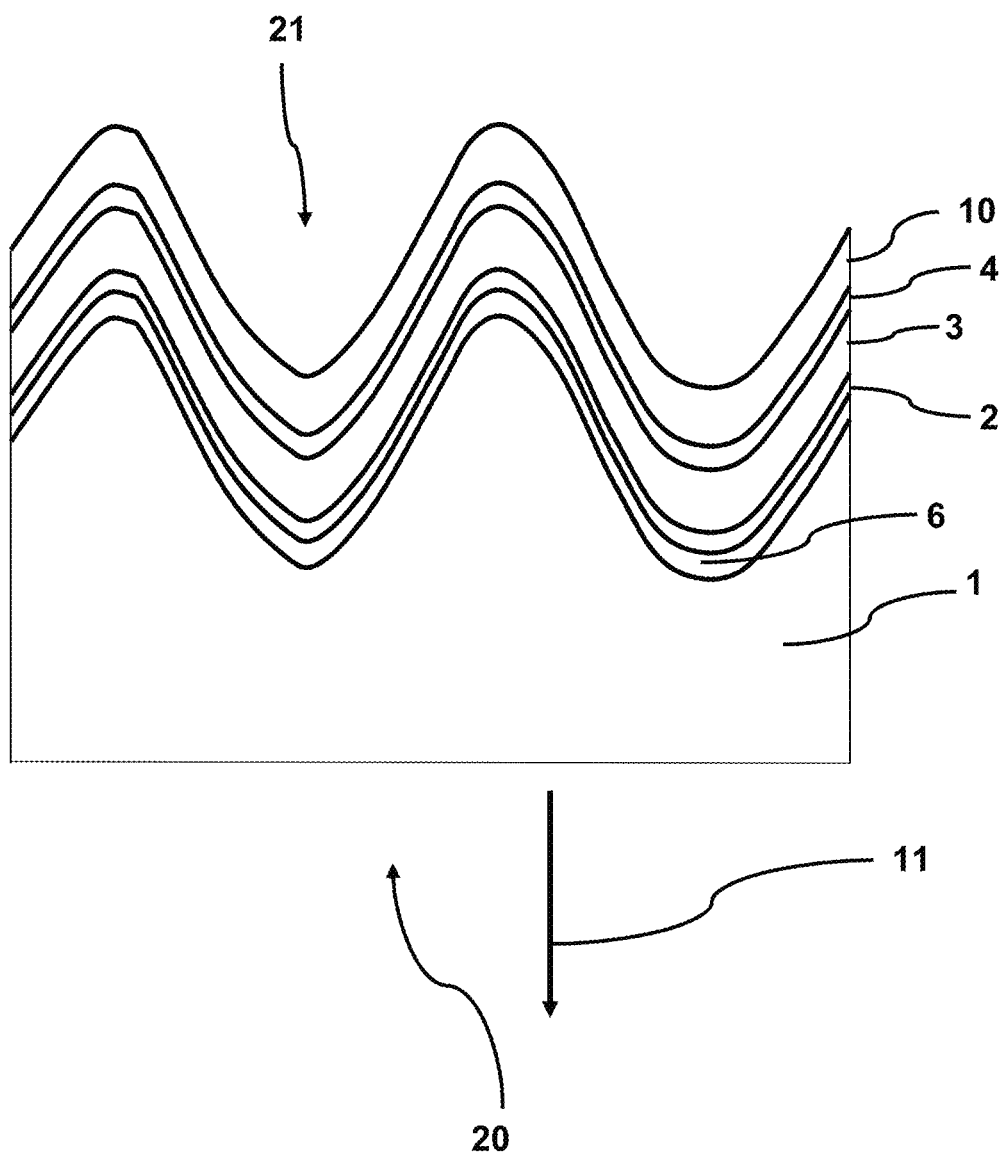
FIG. 3 illustrates a bottom emitter architecture including a smoothing layer.

FIG. 3 illustrates a bottom emitter architecture including a smoothing layer. The bottom emitter architecture comprises a transparent substrate having a bottom substrate surface and a top substrate surface. The top substrate surface has a pattern of raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

A smoothing layer is on the top substrate surface. The smoothing layer may be formed by plasma treatment in an argon atmosphere; thereby the top substrate surface is reconstructed. This may also transform of residual compounds on the top substrate surface.

If the substrate is based on PDMS Silicones (Polydimethylsiloxane) or Polymer blends incorporating silicones then the surface treatment will form microscopic quartz crystals $SiO_x$ on the top substrate surface.

The smoothing surface will have less micro/nano-edges compared to the top substrate surface and the minimum radii will also be greater.

Thus, the smoothing surface will improve the quality of the transducer.

The bottom emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A top electrode is positioned on the top diode layer surface and conforming in shape to the pattern of repeated raised and depressed surface portions.

The top electrode is a metallic electrode or a transparent conductive electrode (TCO).

A top protection layer is positioned on the top of the top electrode and conforms in shape to the pattern of repeated raised and depressed surface portions.

The top protection layer will work as a protection prolonging the lifetime of the light emitting diode.

The bottom emitter architecture will emit light in a general direction indicated by the arrow 11.

Figure 4:
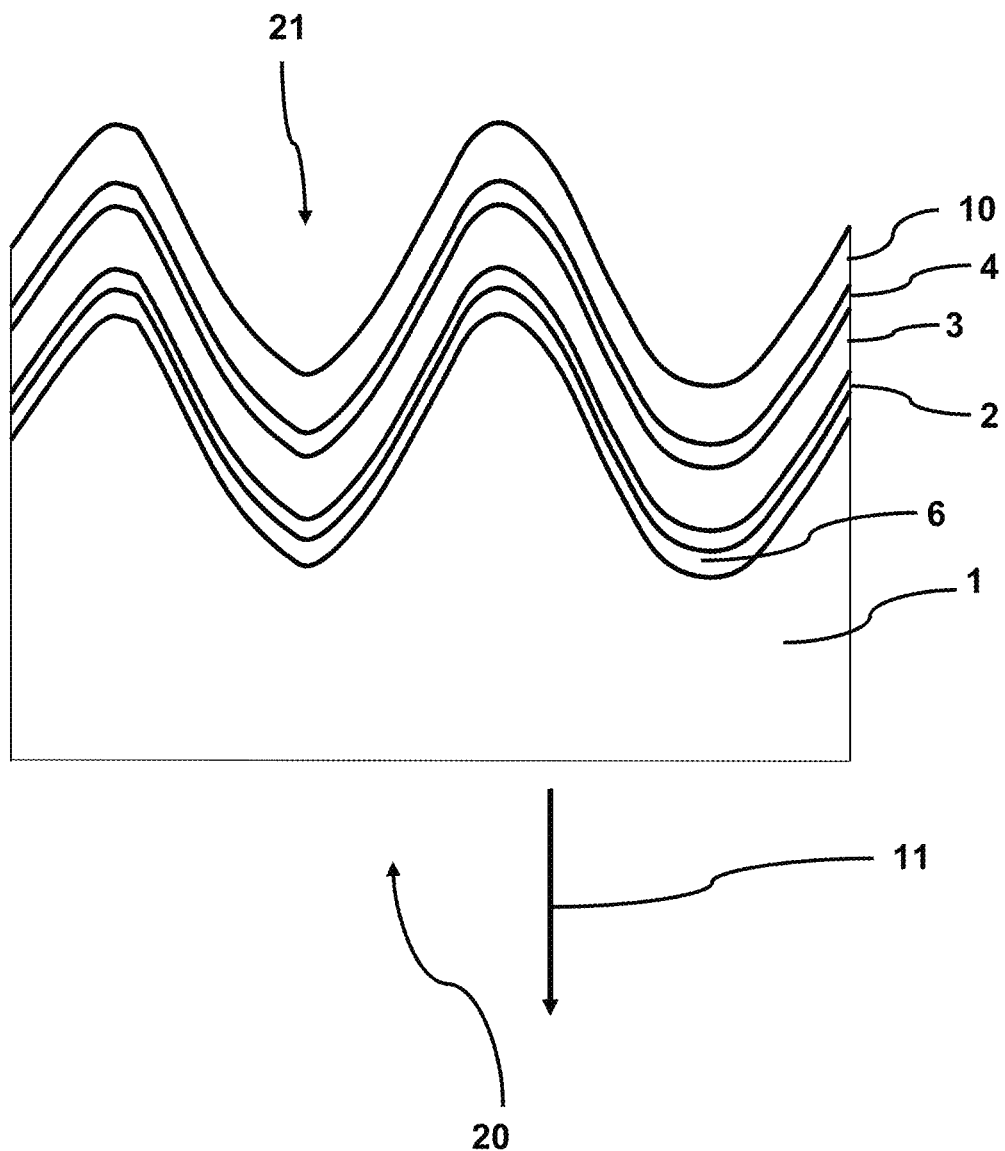
FIG. 4 illustrates a bottom emitter architecture including a SiOx smoothing layer.

FIG. 4 illustrates a bottom emitter architecture including a $SiO_x$ smoothing layer. The bottom emitter architecture comprises a transparent substrate having a bottom substrate surface and a top substrate surface. The top substrate surface has a pattern of repeated raised and depressed surface portions, which extends in at least one direction.

The substrate may be made of transparent PDMS silicones or polymer blends incorporating silicones.

The substrate may have a design like but not limited to the disclosed surfaces in FIG. 11 or 12.

A smoothing layer is on the top substrate surface. The smoothing layer is formed by depositing $SiO_x$ on the top substrate surface.

The smoothing surface will have less micro/nano-edges compared to the top substrate surface and the minimum radii will also be greater.

This will improve the quality of the transducer and the adherence is significantly improved for the subsequent application of further layer.

The bottom emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A top electrode is positioned on the top diode layer surface and conforming in shape to the pattern of repeated raised and depressed surface portions.

The top electrode is a metallic electrode or a transparent conductive electrode (TCO).

A top protection layer is positioned on the top of the top electrode and conforms in shape to the pattern of repeated raised and depressed surface portions.

The top protection layer will work as a protection prolonging the lifetime of the light emitting diode.

The bottom emitter architecture will emit light in a general direction indicated by the arrow 11.

Figure 5:
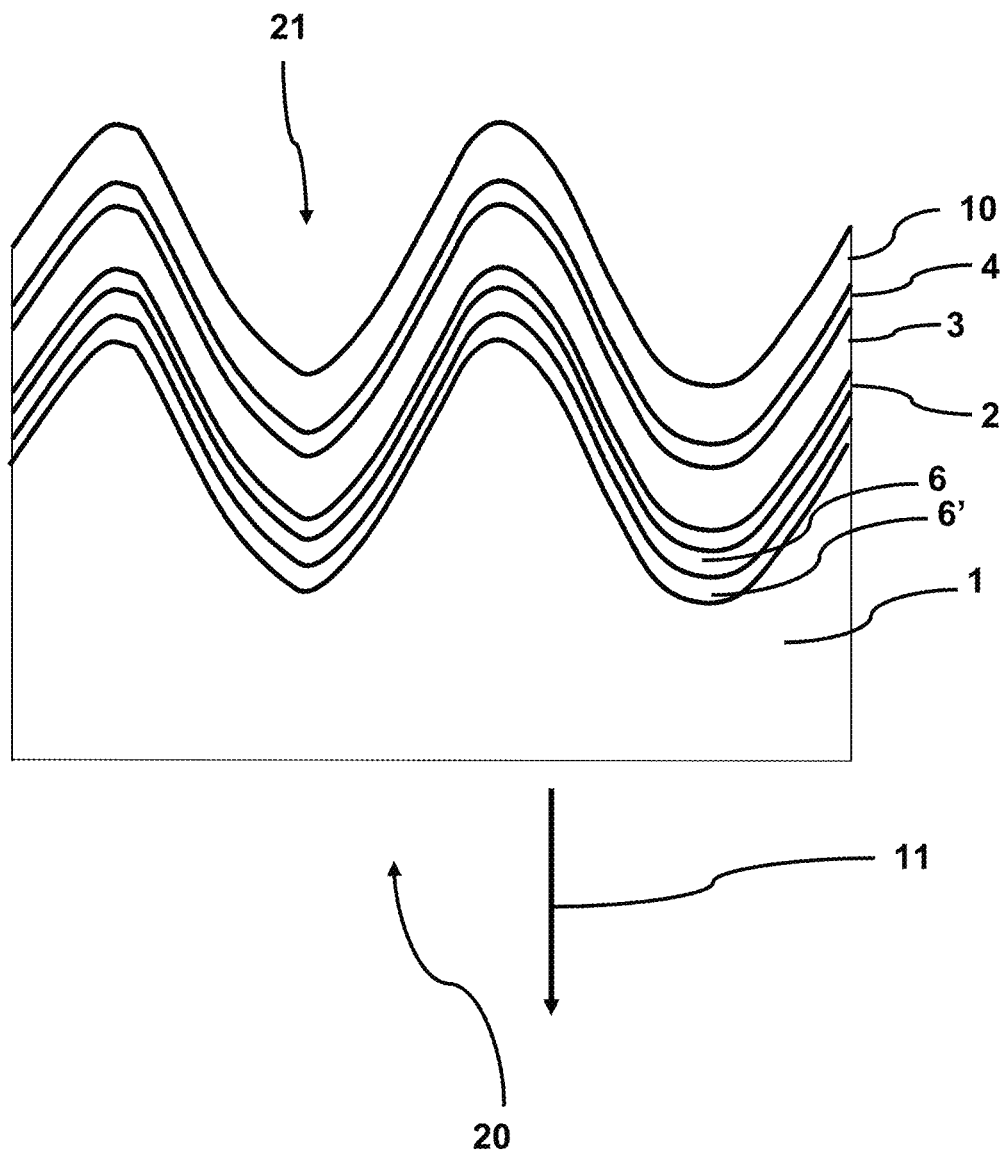
FIG. 5 illustrates a bottom emitter architecture including one or more encapsulating layers.

FIG. 5 illustrates a bottom emitter architecture including one or more encapsulating layers. The bottom emitter architecture comprises a transparent substrate having a bottom substrate surface and a top substrate surface. The top substrate surface has a pattern of repeated raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

One or more encapsulating layers are above the top substrate surface. The encapsulating layers may be formed by depositing $SiO_x$ or other quarts grain structures on the top substrate surface. This may be followed by one or more layers of either oxide or nitride or oxi-nitride compounds.

The combined effect of the one or more encapsulating layers is that the organic layer is protected by from the ambient atmosphere, in particular water and oxygen.

The smoothing surface will have less micro/nano-edges compared to the top substrate surface and the minimum radii will also be greater.

The bottom emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A top electrode is positioned on the top diode layer surface and conforming in shape to the pattern of raised and depressed surface portions.

The top electrode is a metallic electrode or a transparent conductive electrode (TCO).

A top protection layer is positioned on the top of the top electrode and conforms in shape to the pattern of raised and depressed surface portions.

The top protection layer will work as a protection prolonging the lifetime of the light emitting diode.

The bottom emitter architecture will emit light in a general direction indicated by the arrow 11.

Figure 6:
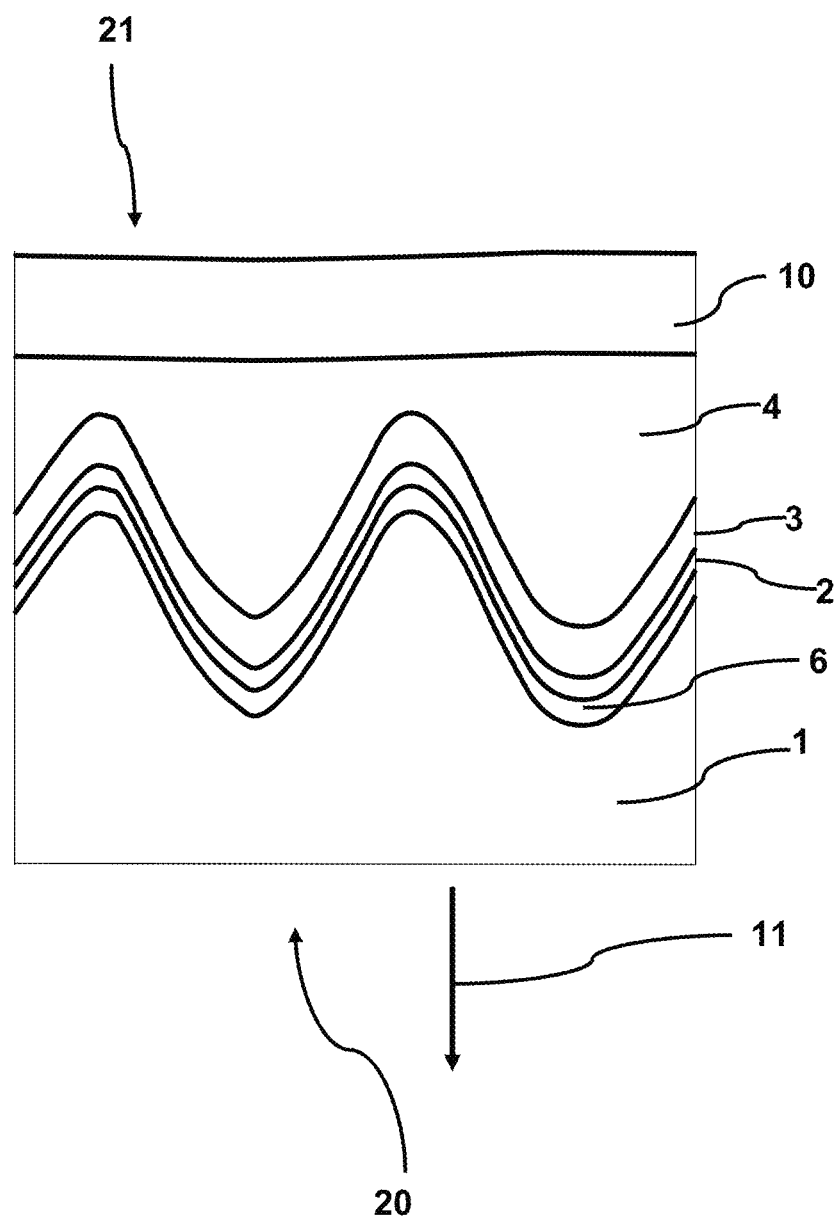
FIG. 6 illustrates a bottom emitter architecture having a planar top surface.

FIG. 6 illustrates a bottom emitter architecture having a planar top surface. The bottom emitter architecture comprises a transparent substrate having a bottom substrate surface and a top substrate surface. The top substrate surface has a pattern of repeated raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

A smoothing layer is on the top substrate surface. The smoothing layer may be formed by plasma treatment in an argon atmosphere; thereby the top substrate surface is reconstructed. This may also transform of residual compounds on the top substrate surface.

The smoothing layer may be formed by depositing $SiO_x$ on the top substrate surface.

The smoothing layer may comprise of a combination of the top substrate surface being plasma treated in an argon atmosphere, and if the substrate is not made of PDMS silicones or polymer blends incorporating silicones then the plasma treatment is followed by an act of depositing $SiO_x$.

The smoothing surface will have less micro/nano-edges compared to the top substrate surface and the minimum radii will also be greater.

The bottom emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A conductive polymer top electrode is positioned on the top diode layer surface and conforming in shape to the pattern of raised and depressed surface portions.

The conductive polymer top electrode is made of a conductive polymer such as PEDOT or PEDOT:PSS or a conductive silicone blend.

The conductive polymer top electrode has a planar top electrode surface.

A top protection layer is positioned on the planar top electrode surface.

The top protection layer will work as encapsulation layer prolonging the lifetime of the light emitting diode by protecting the organic layer from the ambient atmosphere.

The bottom emitter architecture will emit light in a general direction indicated by the arrow 11.

Figure 7:
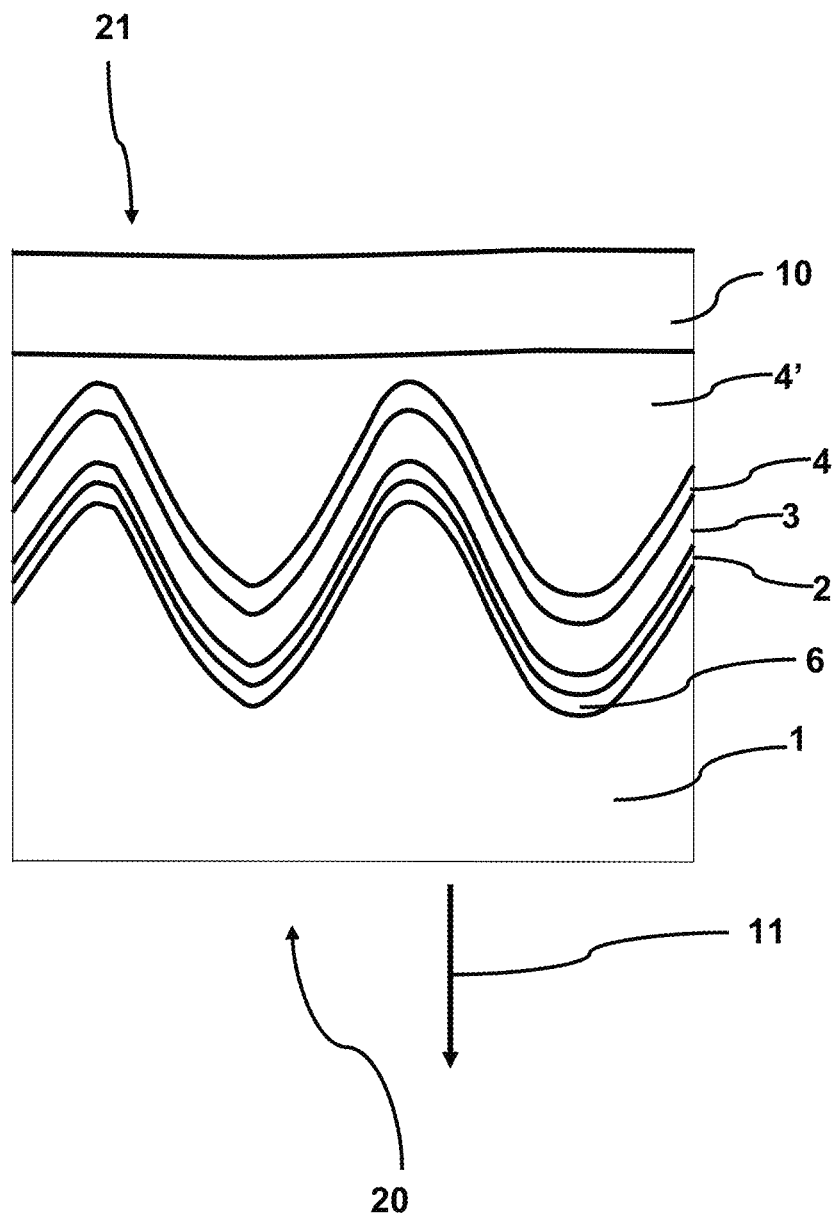
FIG. 7 illustrates a bottom emitter architecture having a planar top surface and a composite top electrode.

FIG. 7 illustrates a bottom emitter architecture having a planar top surface and a composite top electrode.

The bottom emitter architecture comprises a transparent substrate having a bottom substrate surface and a top substrate surface. The top substrate surface has a pattern of repeated raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

A smoothing layer is on the top substrate surface. The smoothing layer may be formed by plasma treatment in an argon atmosphere; thereby the top substrate surface is reconstructed. This may also transform of residual compounds on the top substrate surface.

The smoothing layer may be formed by depositing $SiO_x$ on the top substrate surface.

The smoothing layer may comprise of a combination of the top substrate surface being plasma treated in an argon atmosphere, followed by an act of depositing $SiO_x$.

The smoothing surface will have less micro/nano-edges compared to the top substrate surface and the minimum radii will also be greater.

The bottom emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top organic surface layer that is larger than the surface area occupied by the bottom substrate surface in relaxed state.

The diode layer may comprise one or more organic diodes or one or more inorganic semiconductor diodes or one or more polymer diodes or one or more quantum dots.

A conductive polymer top electrode is positioned on the top organic layer surface and conforming in shape to the pattern of repeated raised and depressed surface portions.

The conductive polymer top electrode is made of a conductive polymer such as PEDOT or PEDOT:PSS or a conductive silicone blend.

The conductive polymer top electrode has a planar top electrode surface

A top protection layer is positioned on the planar top electrode surface.

The top protection layer will work as encapsulation layer prolonging the lifetime of the by protecting the organic layer from the ambient atmosphere.

The bottom emitter OLED architecture will emit light in a general direction indicated by the arrow 11.

Figure 8:
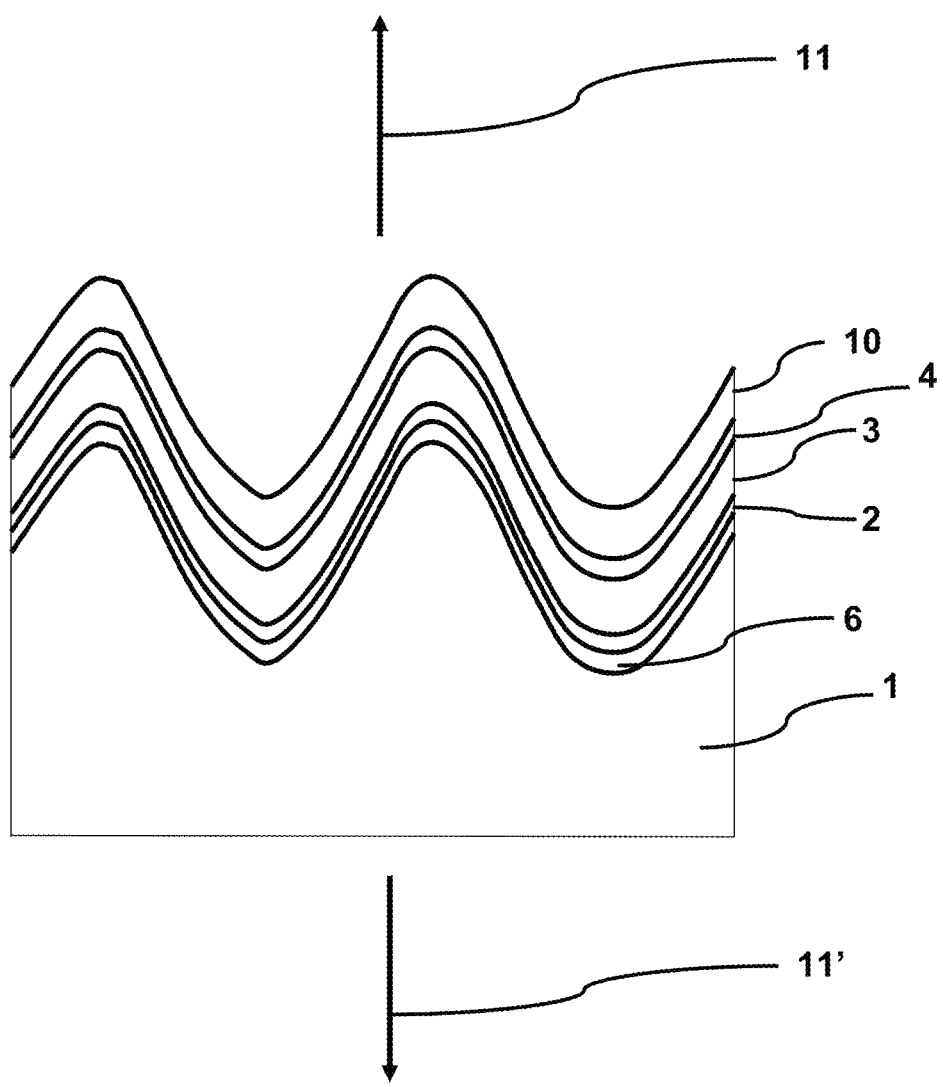
FIG. 8 illustrates a top and bottom emitter architecture.

FIG. 8 illustrates a top and bottom emitter architecture. The top and bottom emitter architecture comprises a transparent substrate having a bottom substrate surface and a top substrate surface. The top substrate surface has a pattern of raised and depressed surface portions, which extends in at least one direction.

The substrate may be made of transparent PET or PEN or PUR/PU or PDMS silicones or polymer blends incorporating silicones.

The substrate may have a design like but not limited to the disclosed surfaces in FIG. 11 or 12.

A smoothing layer is on the top substrate surface. The smoothing layer may be formed by plasma treatment in an argon atmosphere; thereby the top substrate surface is reconstructed. This may also transform of residual compounds on the top substrate surface.

If the substrate is based on PDMS Silicones (Polydimethylsiloxane) or Polymer blends incorporating silicones then the surface treatment will form microscopic quartz crystals $SiO_x$ on the top substrate surface.

The smoothing surface will have less micro/nano-edges compared to the top substrate surface and the minimum radii will also be greater.

Thus, the smoothing surface will improve the quality of the transducer.

The bottom and top emitter architecture further comprises a transparent bottom electrode positioned on the smoothing layer and conforming in shape to top substrate surface.

The transparent bottom electrode is of the TCO or TME type.

A diode layer is positioned to the bottom electrode and conforms in shape to the top substrate surface. Thereby the diode layer has the pattern of repeated raised and depressed surface portions.

The diode layer has a bottom diode layer surface facing towards the bottom side and a top diode layer surface facing towards the top side and with an area of the top diode surface layer that is larger than the surface area occupied by the bottom substrate surface in relaxed state.

The diode layer may comprise one or more organic diodes or one or more inorganic semiconductor diodes or one or more polymer diodes or one or more quantum dots.

A transparent top electrode is positioned on the top diode layer surface and conforming in shape to the pattern of repeated raised and depressed surface portions.

The transparent top electrode is of the TCO or TME type. A top protection layer is positioned on the top of the top electrode and conforms in shape to the pattern of repeated raised and depressed surface portions.

The top protection layer will work as a protection prolonging the lifetime of the light emitting diode.

The top and bottom emitter architecture will emit light in a directions indicated by the arrows 11, 11'.

Figure 9:
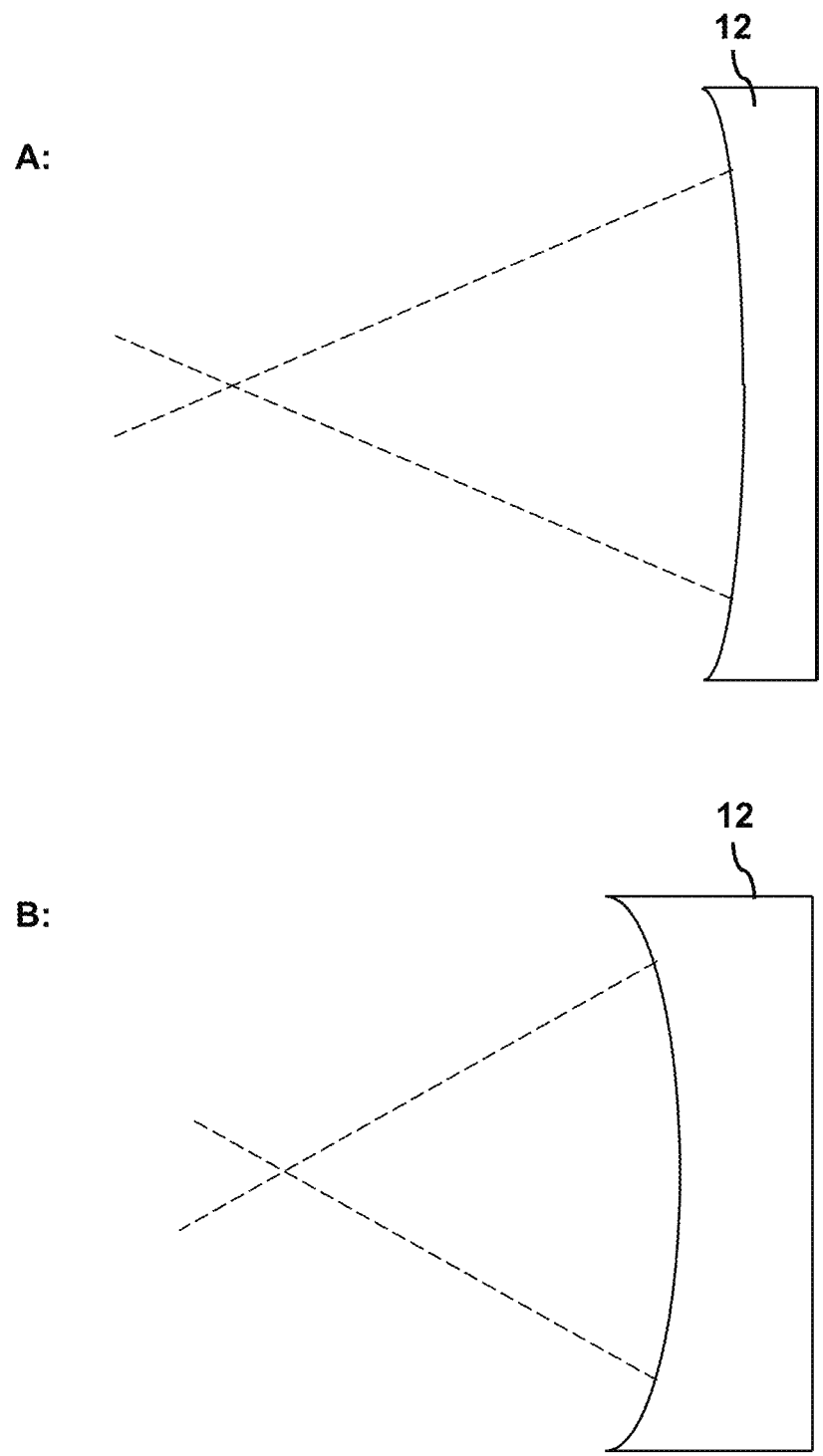
FIG. 9 illustrates a flexible film mounted on a silicone lens.

FIG. 9 illustrates a bottom emitter architecture having a lens shaped bottom surface. The transducer may have a layer structure similar to FIGS. 1-8 and a top substrate surface similar but not limited to the surfaces disclosed in FIG. 11 or 12.

The transducer has a lens shaped bottom surface. The lens shape can be concave as in FIG. 9 or convex. The lens may also be a Fresnel lens.

FIGS. 9A and 9B shows a bottom emitter architecture having a lens shaped bottom surface having concave lenses with different curvatures.

Figure 10:
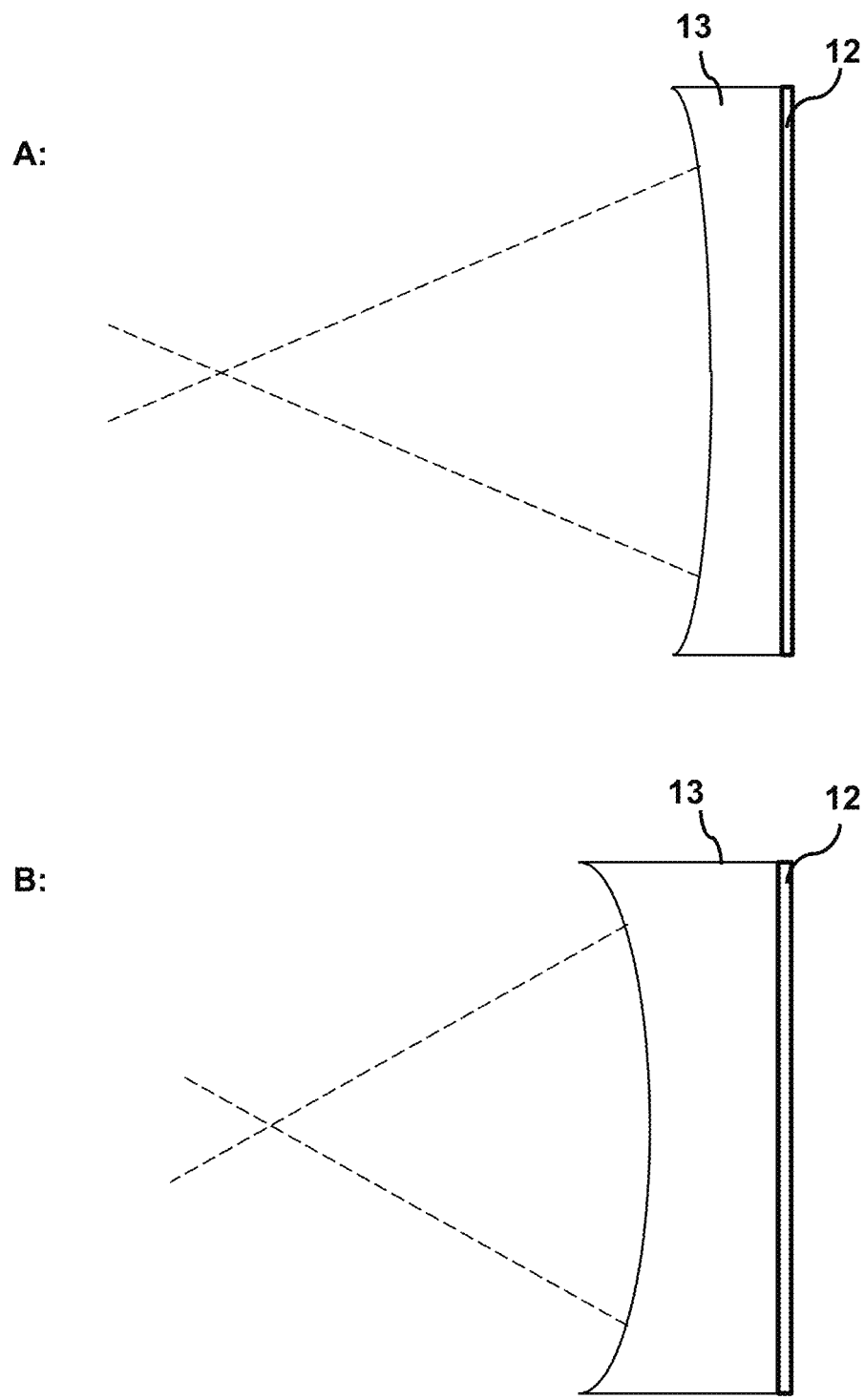
FIG. 10 illustrates a transducer mounted on a silicone lens.

FIG. 10 illustrates a transducer mounted on an optical element.

The transducer may have a layer structure similar to FIGS. 1-8 and a top substrate surface similar but not limited to the surfaces disclosed in FIG. 11 or 12.

The transducer is mounted on a silicone lens. The silicone lens shape can be concave as in FIG. 10 or convex. The optical element may also be a Fresnel lens FIGS. 10A and 10B shows a transducer mounted on silicone lenses having concave lenses with different curvatures. The optical element may be a silicone lens.

FIG. 11 illustrates the compliancy of the transducer. The transducer in FIG. 11A-B has a series of wave fronts in a direction. The substrate of the transducer is flexible as it can be stretch and compressed in all directions, but this is not the case for the transducer in FIG. 11A-B as it can only stretch and/or compress in a single direction.

The layers on the top substrate surface are neither stretchable nor compressible and the layers will break at elongation <1%. However, the layers are thin and this makes them bendable. If a force is applied to the transducer in a direction perpendicular to the wave fronts the transducer will stretch or compress in that direction. FIG. 11B illustrates what happens if the transducer is stretched to a length of L'. The substrate stretches, but the layers do not stretch. The bending of the layers is decreased as the transducer stretches and the surface pattern of the plurality of repeating raised and depressed micro-scale surface portions is changed as the wavelength is increased and the amplitude is decreased.

If a force is applied to the transducer in a direction parallel to the wave fronts the layers will crack.

Thus, the transducer in FIG. 11A-B is compliant in a direction perpendicular to the wave fronts.

FIG. 12 illustrates two different embodiments of the top substrate surface. Each substrate is compliant in two directions, which are perpendicular to each other. This enables the transducer to be stretched and/or compressed in two directions at the same time, i.e. the transducer may conform to a true 3D surface.

Figure 13:
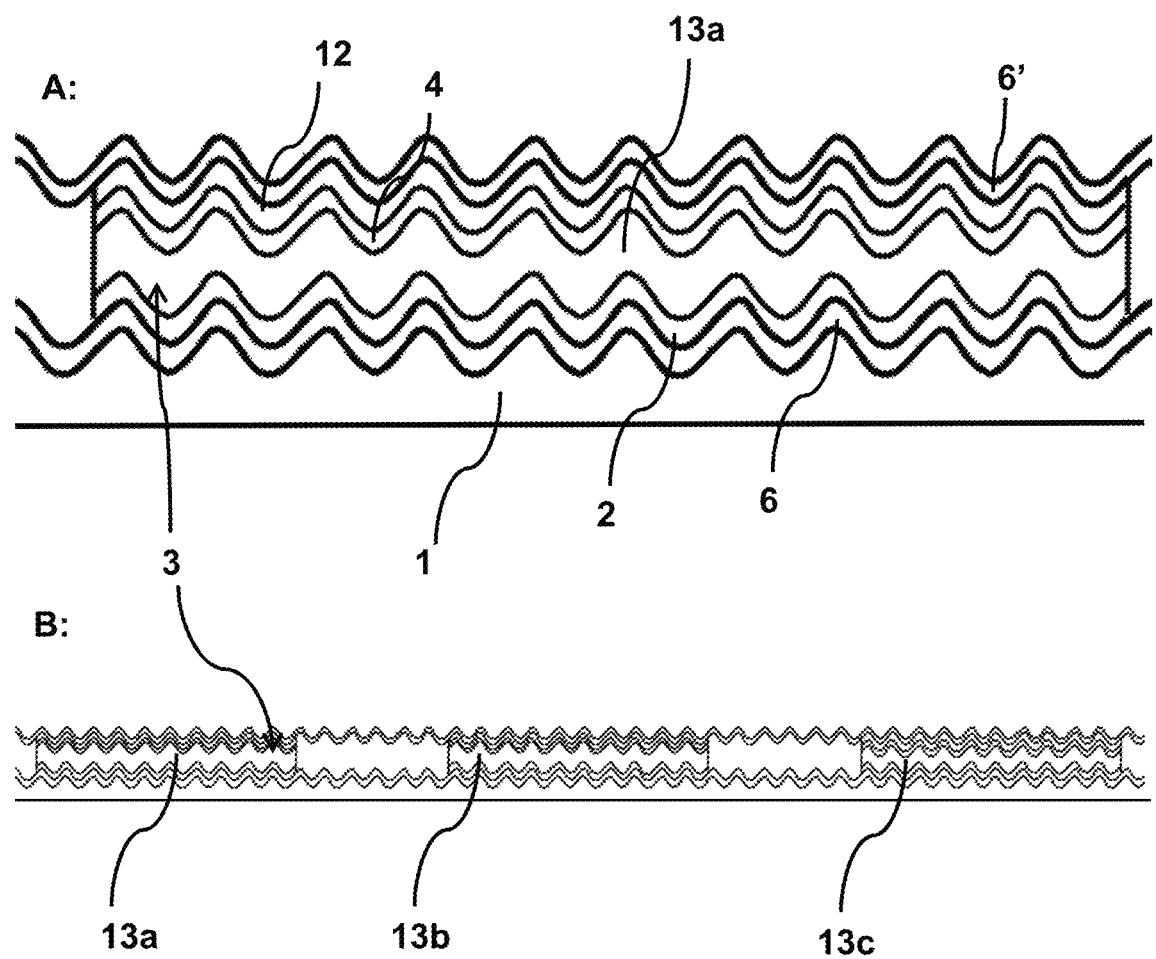
FIG. 13 illustrates an embodiment of a light emitting transducer for a display.

FIG. 13 illustrates an embodiment of a light emitting transducer for a display.

FIG. 13A discloses a close-up of a single diode comprising a substrate 1, a bottom encapsulation layer 6 for reducing the diffusion of moisture and oxygen towards the light emitting diode layer 3, a bottom electrode 2, a light emitting diode 13a, a top electrode 4 on the light emitting diode layer 3a connected to a thin-film transistor for of the light emission of the single diode and a top encapsulation layer 6' for reducing the diffusion of moisture and oxygen towards the light emitting diode layer 3.

The light emitting diode 13a may be an organic diode emitting red, green, blue or any other colour.

FIG. 13A discloses an RGB-group comprising three light emitting diodes 13a, 13b and 13c. Thereby the transducer may produce any colour.

As described above, the silicone substrate in itself possesses elastic properties allowing the substrate to be stretched to some extent. However, providing the surface of the silicone substrate with a surface pattern defining troughs and crests along one, two or more directions significantly enhances the elastic properties of the substrate. It should be noted that the elasticity of the transducer renders the transducer robust with respect to changes in the dimensions and/or shape of a surface having the transducer attached thereto, since the elasticity of the transducer allows it to change its shape to follow the changes in the mounting surface. This prolongs the expected lifetime of the transducer and allows it to be attached to an even larger variety of different kinds of surfaces. Changes in the dimensions and/or shape of a surface having the transducer attached thereto may by way of example be caused by environmental influences, such as changes in temperature, changes in moisture level, vibrations, shocks, etc.

Production of a transducer according to the form of an OLED lighting device on a substrate in the form of a preferably silicone web, foil or sheet, may be characterized in carrying said silicone web, foil or sheet with said front side facing upwards supported on a top course of a carrier, being an endless conveyor or a similar transportation unit in successive order through the following treatment stations, where a treatment station can include a cluster of treatment equipment:

in a first treatment station providing said surface pattern of the front side of said substrate 1 with a plasma treating in an argon/oxygen (Ar/O$_2$) atmosphere, in a second treatment station applying a rear side transparent conductive electrode 2 onto the plasma treated surface, a shadow mask is placed on top of the substrate, the layer is deposited by bipolar MF sputtering in an argon (Ar) atmosphere, and shadow mask is removed in a third treatment station applying one or more group of layers each consisting of a light emitting layer, a hole transport layer and a hole injection layer on to said surface pattern of the front side of said electrode, the layers are deposited in a repeating sequence of placing shadow masks is on top of the substrate, depositing layer by Vacuum Thermal Evaporation technique, and removing shadow masks in a fourth treatment station applying a front side electrode 4, being an electric conductive layer, the layer is deposited by placing a shadow mask, depositing the layer by DC or pulsed DC sputtering in an argon (Ar) atmosphere, and removing the shadow mask in a fifth treatment station applying a protective non-conductive layer by use of a bipolar MF sputtering process in an atmosphere being a mix of argon (Ar), oxygen (O2) and Nitrogen (N)

in a potential final treatment station, a rotating winding station is winding up the finished web, foil of substrate including OLEDs, alternative the finished sheet of substrate including OLEDs is stacked.

Extra treatment stations applying encapsulation layers can optional be inserted in above described series of treatments, e.g.

in an extra treatment station after first treatment station and before second treatment station applying an encapsulation layer by use of a bipolar MF sputtering process in an atmosphere being a mix of argon (Ar), oxygen (O2) and Nitrogen (N)

in an extra treatment station after forth treatment station and before fifth treatment station applying an encapsulation layer by use of a bipolar MF sputtering process in an atmosphere being a mix of argon (Ar), oxygen (O2) and Nitrogen (N)

Production of a transducer according to the form of an OLED display device on a substrate in the form of a preferably silicone web, foil or sheet, may be characterized in carrying said silicone web, foil or sheet with said front side facing upwards supported on a top course of a carrier, being an endless conveyor or a similar transportation unit in successive order through the following treatment stations, where a treatment station can include a cluster of treatment equipment:

in a first treatment station providing said surface pattern of the front side of said substrate 1 with a plasma treating in an argon/oxygen (Ar/O$_2$) atmosphere, in a second treatment station applying a rear side transparent conductive electrode 2 onto the plasma treated surface, a shadow mask is placed on top of the substrate, the layer is deposited by bipolar MF sputtering in an argon (Ar) atmosphere, and shadow mask is removed in a third treatment station applying the pixels in one or more group of layers each consisting of a light emitting layer, a hole transport layer and a hole injection layer on to said surface pattern of the front side of said electrode is deposited in a repeating sequence of placing shadow masks is on top of the substrate, depositing layer by Vacuum Thermal Evaporation technique, and removing shadow masks in a forth treatment station applying the switching matrix backplane consisting of one or more group of layers of conducting electrodes, insulation layers and the Oxide TFT (Thin Film Transistor) layer on to said surface pattern of the front side of said electrode is deposited in a repeating sequence of placing shadow masks is on top of the substrate, depositing layers by a combined set of PVD, CVD and PECVD processes and removing shadow mask;

in a fifth treatment station applying an protective non-conductive layer by use of a bipolar MF sputtering process in an atmosphere being a mix of argon (Ar), oxygen (O2) and Nitrogen (N); and in a potential final treatment station, a rotating winding station is winding up the finished web, foil of substrate including OLEDs, alternative the finished sheet of substrate including OLEDs is stacked.

Extra treatment stations applying encapsulation layers can optional be inserted in above described series of treatments, e.g.

in an extra treatment station after first treatment station and before second treatment station applying an encapsulation layer by use of a bipolar MF sputtering process in an atmosphere being a mix of argon (Ar), oxygen (O2) and Nitrogen (N)

in an extra treatment station after forth treatment station and before fifth treatment station applying an encapsulation layer by use of a bipolar MF sputtering process in an atmosphere being a mix of argon (Ar), oxygen (O2) and Nitrogen (N)

Figure 14:
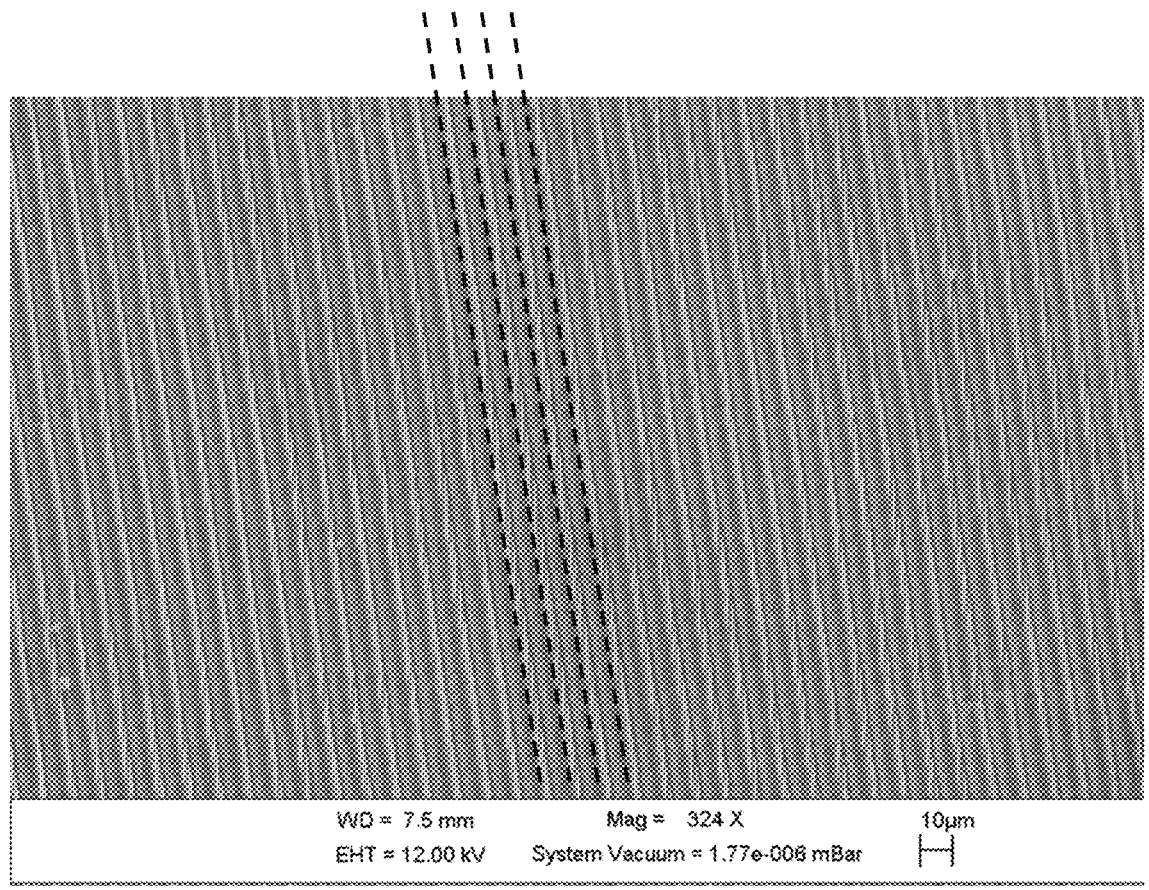
FIG. 14 illustrates a SEM photo of a top substrate surface having parallel wave fronts.

FIG. 14 illustrates an SEM photo of a top substrate surface having parallel wave fronts, see dotted lines. The top substrate surface is orderly formed and can be made in a slot die casting process or a hot embossing process. Each wave front is parallel to all the other wave fronts.

The substrate is stretchable in the direction parallel to the wave fronts.

DRAWING REFERENCE NUMBERS

1: Substrate
2: Bottom electrode
3: Light emitting diode layer
4: Top electrode
6: Smoothing/encapsulation layer
9: Transducer
10: Top protective layer (possibly transparent)
11: Emitted light
12: Thin-film transistor
13: Diode
20: Bottom side
21: Top side

The invention claimed is:

1. A light emitting transducer comprising:
a flexible sheet having a bottom side and a top side, the flexible sheet including:
a silicone substrate that is stretchable and compressible, the substrate having a bottom substrate surface at the bottom side, and a top substrate surface facing towards the top side, the top substrate surface comprising a surface pattern of a plurality of raised and depressed micro-scale surface portions which extend in at least one direction;
a light emitting diode layer above the substrate and conforming in shape to the top substrate surface, the light emitting diode layer corresponding with the surface pattern of the top substrate surface, wherein the light emitting diode layer has a bottom diode surface facing towards the bottom side, and a top diode surface facing towards the top side,
a bottom electrode on the bottom diode surface; and
a top electrode on the top diode surface;
wherein the top substrate surface is plasma-treated for forming SiOx.

2. The light emitting transducer according to claim 1, wherein the light emitting diode layer comprises one or more organic diodes, or one or more inorganic semiconductor diodes, or one or more polymer diodes, or one or more quantum dots.

3. The light emitting transducer according to claim 1, further comprising a TFT-array having a plurality of interconnected thin-film transistors, the thin-film transistors corresponding with respective diodes at the light emitting diode layer.

4. The light emitting transducer according to claim 1, further comprising a bottom smoothing layer between the substrate and the bottom electrode, and wherein the bottom smoothing layer comprises $SiO_x$.

5. The light emitting transducer according to claim 1, wherein the light emitting transducer is a top emitter configured to emit light in an opposite direction relative to the silicone substrate.

6. The light emitting transducer according to claim 1, wherein the plurality of raised and depressed micro-scale surface portions define parallel wave fronts in one or two directions.

7. The light emitting transducer according to claim 1, wherein the light emitting transducer is a bottom emitter configured to emit light through the silicone substrate.

8. The light emitting transducer according to claim 1, wherein the plurality of raised and depressed micro-scale surface portions extend in two directions.

9. The light emitting transducer according to claim 1, wherein the light emitting diode layer comprises a plurality of diodes.

10. The light emitting transducer according to claim 1, wherein the top electrode is transparent.

11. The light emitting transducer according to claim 1, further comprising a bottom encapsulating layer below the bottom electrode and above the substrate.

12. The light emitting transducer according to claim 11, wherein the bottom encapsulating layer comprises a nitride-based layer or an oxide-based layer or an oxi-nitride based layer.

13. The light emitting transducer according to claim 1, further comprising a top encapsulating layer above the top electrode.

14. The light emitting transducer according to claim 13, wherein the top encapsulating layer comprises a nitride-based layer or an oxide-based layer or oxi-nitride based layer.

15. The light emitting transducer according to claim 1, wherein the top electrode comprises a conductive polymer.

16. The light emitting transducer according to claim 15, wherein the top electrode comprises a metallic electrode between the conductive polymer and the light emitting diode layer.

17. The light emitting transducer according to claim 15, wherein the top electrode has a planar top electrode surface.

* * * * *